(12) United States Patent
Aritsuka et al.

(10) Patent No.: US 11,430,730 B2
(45) Date of Patent: Aug. 30, 2022

(54) WIRING SUBSTRATE AND SEMICONDUCTOR DEVICE

(71) Applicant: DAI NIPPON PRINTING CO., LTD., Tokyo (JP)

(72) Inventors: Yuki Aritsuka, Tokyo (JP); Takamasa Takano, Tokyo (JP); Masaya Tanaka, Tokyo (JP); Yumi Yoshii, Tokyo (JP); Miyuki Suzuki, Tokyo (JP); Shuji Sagara, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/121,222

(22) Filed: Dec. 14, 2020

(65) Prior Publication Data

US 2021/0134717 A1    May 6, 2021

Related U.S. Application Data

(63) Continuation of application No. PCT/JP2019/001122, filed on Jan. 16, 2019.

(30) Foreign Application Priority Data

Jun. 21, 2018   (JP) .............................. JP2018-117765

(51) Int. Cl.
   *H01L 23/522*   (2006.01)
   *H01L 49/02*    (2006.01)
   *H01L 21/3105*  (2006.01)

(52) U.S. Cl.
   CPC ...... *H01L 23/5223* (2013.01); *H01L 23/5226* (2013.01); *H01L 28/40* (2013.01); *H01L 21/31053* (2013.01); *H01L 28/55* (2013.01)

(58) Field of Classification Search
   CPC . H01L 23/5223; H01L 23/5226; H01L 28/40; H01L 21/486; H01L 23/49822;
   (Continued)

(56) References Cited

U.S. PATENT DOCUMENTS

| 2002/0034872 A1 | 3/2002 | Kazama et al. |
| 2004/0169216 A1 | 9/2004 | Kiyotoshi |

(Continued)

FOREIGN PATENT DOCUMENTS

| JP | H03-241864 A | 10/1991 |
| JP | H10-135408 A | 5/1998 |

(Continued)

OTHER PUBLICATIONS

Feb. 12, 2019 International Search Report issued in International Patent Application No. PCT/JP2019/001122.
(Continued)

*Primary Examiner* — Patricia D Valenzuela
(74) *Attorney, Agent, or Firm* — Oliff PLC

(57) ABSTRACT

A wiring substrate of the present disclosure includes a substrate, a first conductive layer, a first insulating layer, and a second conductive layer. The substrate has an insulating surface. The first conductive layer is disposed on the substrate and includes a first part and a second part. The first part has a first thickness. The second part has a second thickness thinner than the first thickness and is adjacent to the first part. The first insulating layer is disposed on the first part and apart from the second part. The first insulating layer is disposed between the second conducting layer and the first part.

26 Claims, 24 Drawing Sheets

(58) Field of Classification Search
CPC ............. H01L 23/49827; H01L 23/481; H01L 23/5227; H01L 28/55; H01L 21/31053; H05K 1/16; H05K 3/46
See application file for complete search history.

(56) References Cited

U.S. PATENT DOCUMENTS

| | | | |
|---|---|---|---|
| 2004/0195567 | A1* | 10/2004 | Ogino ................. H01L 27/0805 257/59 |
| 2005/0056939 | A1 | 3/2005 | Ooi et al. |
| 2007/0158848 | A1* | 7/2007 | Matsumoto ............. H01L 28/75 257/758 |
| 2008/0121956 | A1 | 5/2008 | Kanaya |
| 2010/0117127 | A1* | 5/2010 | Kumura .................. H01L 28/55 257/295 |
| 2011/0035938 | A1 | 2/2011 | Kweon et al. |
| 2015/0235955 | A1 | 8/2015 | Kudo et al. |
| 2017/0230026 | A1* | 8/2017 | Okura ..................... H01G 4/012 |
| 2019/0269013 | A1 | 8/2019 | Takagi et al. |

FOREIGN PATENT DOCUMENTS

| | | |
|---|---|---|
| JP | H11-177244 A | 7/1999 |
| JP | 2004-266009 A | 9/2004 |
| JP | 2005-93597 A | 4/2005 |
| JP | 2007-294580 A | 11/2007 |
| JP | 2008-124405 A | 5/2008 |
| JP | 2008-135648 A | 6/2008 |
| JP | 2008-227177 A | 9/2008 |
| JP | 4447881 B2 | 4/2010 |
| JP | 2010-118417 A | 5/2010 |
| JP | 2011-129665 A | 6/2011 |
| JP | 4916715 B2 | 4/2012 |
| JP | 5295199 B2 | 9/2013 |
| JP | 2017-139422 A | 8/2017 |
| JP | 2018-22894 A | 2/2018 |
| JP | 2018-73888 A | 5/2018 |
| JP | 2018-74134 A | 5/2018 |
| JP | 2018-93061 A | 6/2018 |
| JP | 2019-114635 A | 7/2019 |
| TW | 564536 B | 12/2003 |

OTHER PUBLICATIONS

Feb. 12, 2019 Written Opinion issued in International Patent Application No. PCT/JP2019/001122.
Sep. 18, 2018 Office Action issued in Japanese Patent Application No. 2018-117765.
May 26, 2020 Notice of Allowance issued in Japanese Patent Application No. 2020-522399.
Feb. 10, 2021 Notice of Sending a Duplicate of Opposition, including Opposition Statement and Statement of Evidence filed by a third party against JP Patent No. 6725095.
May 18, 2021 Notice of Reasons for Revocation issued in Japanese Patent No. 6725095 (Application No. 2020-522399).
Jan. 14, 2022 Notice of Sending a Duplicate of Written Opinion issued in Japanese Patent No. 6725095.
Jan. 14, 2022 Decision on Opposition issued in Japanese Patent No. 6725095.
May 17, 2022 Office Action issued in Taiwanese Patent Application No. 108101790.

* cited by examiner

WIRING SUBSTRATE AND SEMICONDUCTOR DEVICE

CROSS-REFERENCE TO RELATED APPLICATIONS

This application is a U.S. continuation application filed under 35 U.S.C. § 111(a), of International Application No. PCT/JP2019/001122, filed on Jan. 16, 2019, which claims priority to Japanese Patent Application No. 2018-117765, filed on Jun. 21, 2018, the disclosures of which are incorporated by reference.

FIELD

The present disclosures relate to a wiring substrate.

BACKGROUND

An MIM (Metal-Insulator-Metal) capacitor may be formed on a substrate with a wiring. This capacitor has a structure in which an insulating layer is sandwiched by conductive layers. The conductive layer and the insulating layer have different thermal expansion coefficient. Therefore, stress is generated by expansion and contraction according to the thermal history due to the manufacturing process or the like. This phenomenon becomes even more pronounced when the wiring is thickened to reduce transmission resistance. When the insulating layer is subjected to this stress, the insulating layer peels off from the conductive layer or cracks in the insulating layer to relieve the stress. Thus, generation of large stress becomes a factor that decreases the reliability of the capacitor. Japanese laid-open patent publication No. H10-135408 discloses a technique in which the insulating layer is an elastic body for stress-relief. This elastic body is an organic material.

SUMMARY

According to the present disclosure, there is provided a wiring substrate including: a substrate; a first conductive layer; a first insulating layer; and a second conductive layer. The substrate has an insulating surface. The first conductive layer is disposed on the substrate and includes a first part and a second part. The first part has a first thickness. The second part has a second thickness thinner than the first thickness and is adjacent to the first part. The first insulating layer is disposed on the first part and apart from the second part. The first insulating layer is disposed between the second conducting layer and the first part.

DESCRIPTION OF EMBODIMENTS

Figure 1:
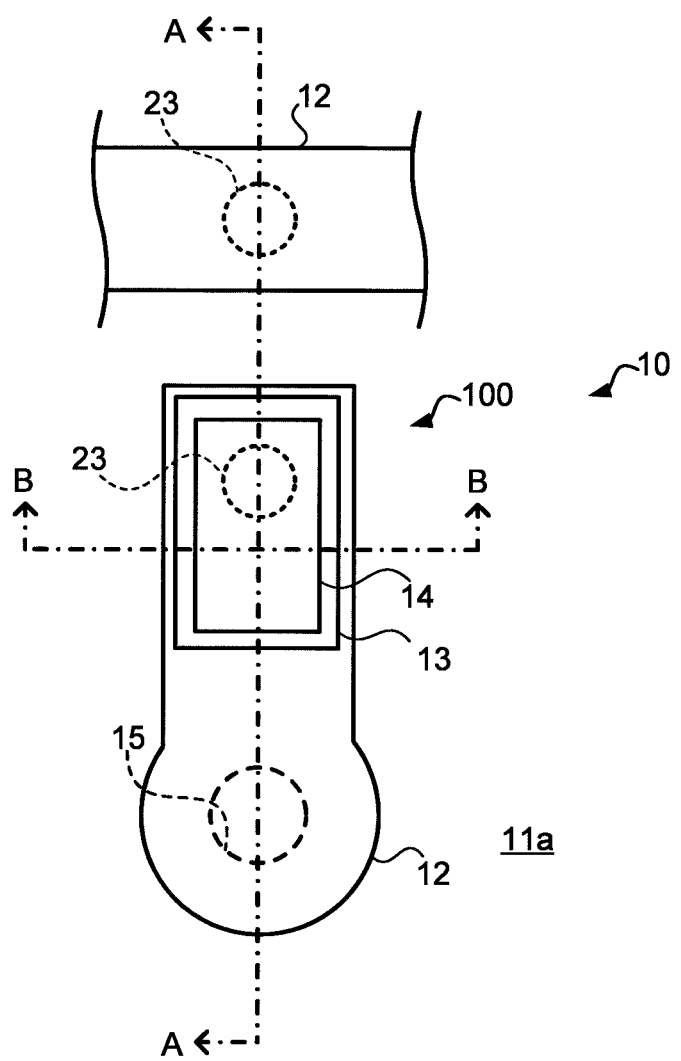
FIG. 1 is a schematic plan view showing an interposer according to a first embodiment of the present disclosure.

Hereinafter, an embodiment of the present disclosure will be described referring to the drawings. Note that each of the embodiments described below is merely an example, and the present disclosure is not to be construed as being limited to these embodiments. In the drawings referred to in the present embodiment, the same portions or portions having similar functions are denoted by the same reference numerals or similar reference numerals (only A, B, etc. are denoted after numerals), and a repetitive description thereof may be omitted. For convenience of description, the dimensional ratio of the drawings may be different from the actual ratio, or a part of the configuration may be omitted from the drawings. In the drawings attached to this specification, for convenience of illustration and understanding, the scale, aspect ratio, and the like may be appropriately changed from those of actual products and exaggerated, or a part of the configuration may be omitted from the drawings. Furthermore, in the following description, when defining a positional relationship between structures, "upper" or "lower" includes not only the case where other structures are disposed directly above or directly below one structure, but also the case where still other structures are interposed between the structures.

First Embodiment

[1. Overall Structure]

An interposer according to an embodiment of the present disclosure has a MIM-structure in which an insulating layer is sandwiched between a conductive layer containing metals and the like. Hereinafter, the MIM-structure will be described as a capacitor in which the insulating layer, which is a dielectric layer, is sandwiched between an upper electrode and a lower electrode. According to the capacitor described below, stress that occurs particularly strongly at an end part of the insulating layer on the lower electrode can be alleviated than that of conventional capacitors.

Organic materials generally have a large dielectric loss tangent. Therefore, when a high-frequency signal is applied to the conductive layer, a large transmission loss occurs, and power efficiency is deteriorated. When the loss of the power is converted to heat, the heat degrades the performance of an element, such as a reduction in element characteristics and a reduction in signal quality due to thermal noise. Thus, in the structure disclosed in Japanese laid-open patent publication No. H10-135408, even if the alleviation of stress, so as to reduce the performance of the element. According to the present disclosure, the reliability of the capacitor can be improved. Hereinafter, the structure of the interposer having the capacitor according to the present disclosure will be specifically described.

Figure 2:
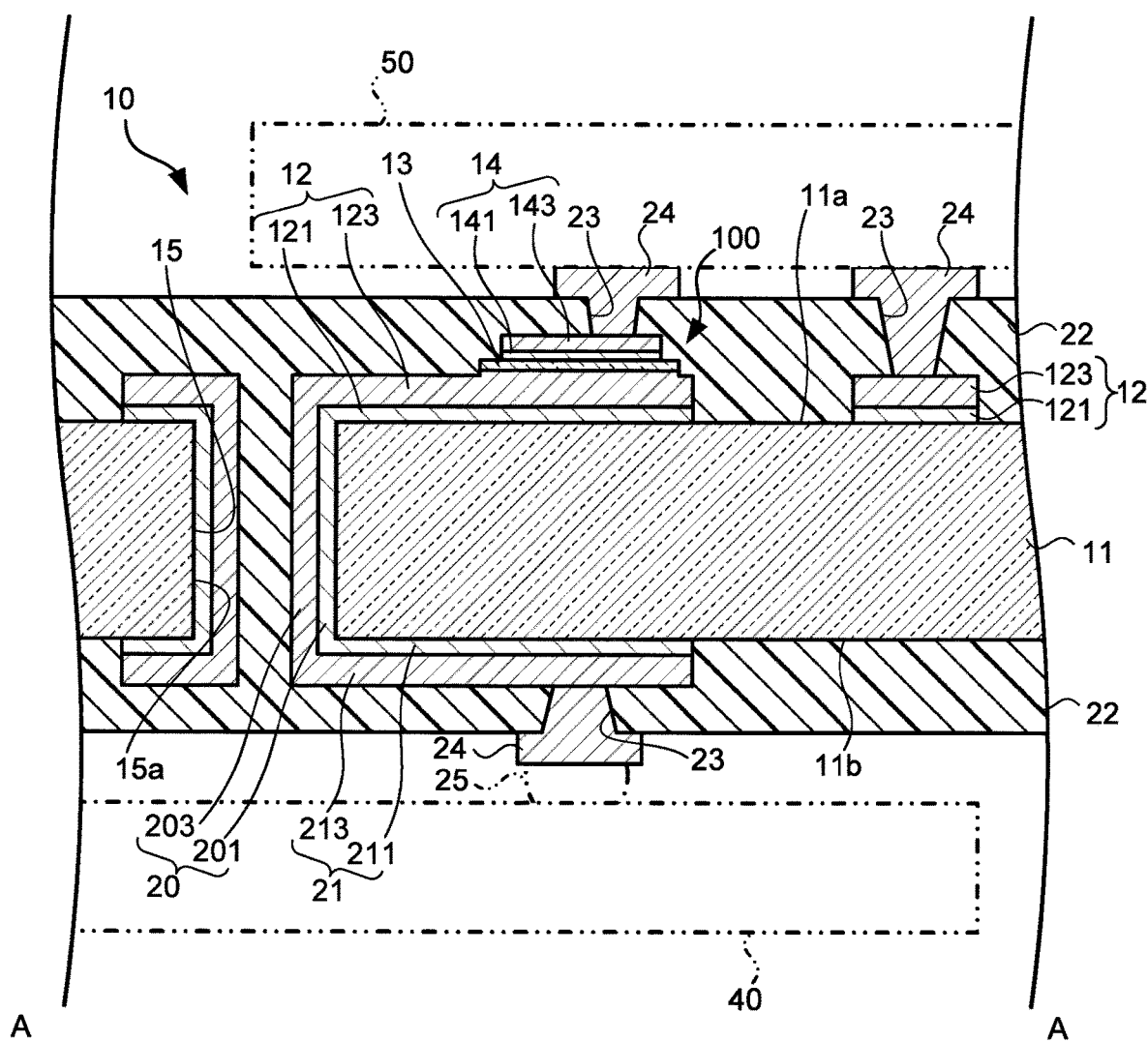
FIG. 2 is a schematic cross-sectional view (line A-A cross-sectional view in FIG. 1) showing the interposer according to the first embodiment of the present disclosure.
Figure 3:
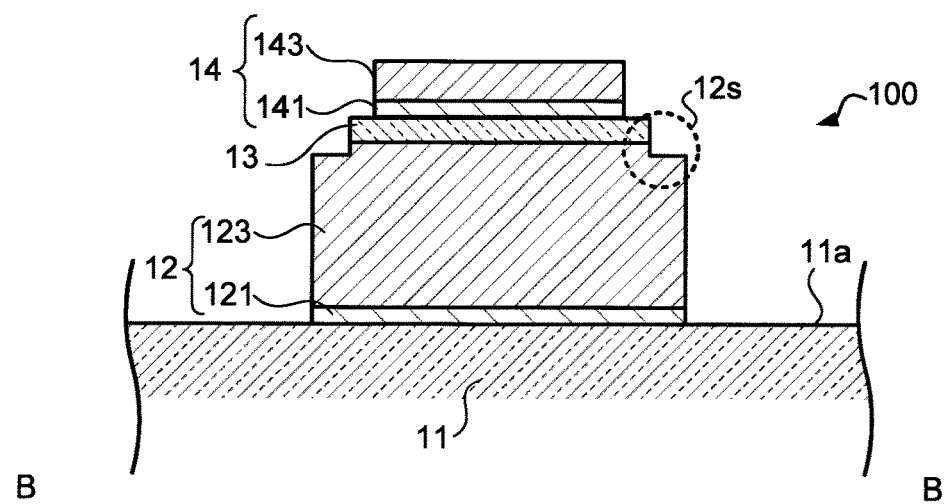
FIG. 3 is a schematic cross-sectional view (B-B line cross-sectional view of FIG. 1) showing a capacitor included in the interposer according to the first embodiment of the present disclosure.

FIG. 1 is a schematic plan view showing an interposer 10 according to the first embodiment of the present disclosure. FIG. 2 is a schematic cross-sectional view (line A-A cross-sectional view in FIG. 1) showing the interposer 10 according to the first embodiment of the present disclosure. FIG. 3 is a schematic cross-sectional view (line B-B cross-sectional view in FIG. 1) showing a capacitor 100 included in the interposer 10 according to the first embodiment of the present disclosure. In FIGS. 1 and 3, so that the positional relation of a substrate 11, a first conductive layer 12, a first insulating layer 13 and a second conductive layer 14 is easy to understand, some configurations are omitted. In this example, in the capacitor 100, the first conductive layer 12 corresponds to the lower electrode, the first insulating layer 13 corresponds to the dielectric layer, the second conductive layer 14 corresponds to the upper electrode.

The interposer 10 comprises the substrate 11, the first conductive layer 12, the first insulating layer 13 and the second conductive layer 14. The substrate 11 has a first surface 11a and a second surface 11b opposed to the first surface 11a. The substrate 11 is a substrate having an insulating surface, in this example an alkali-free glass. The substrate 11 may be an inorganic insulating material other than glass, an organic material, or a semiconductor substrate. The substrate is preferably an insulating material and has insulating properties at least on its surface.

A thickness of the substrate 11 is preferably 50 μm or more and 700 μm or less and is 400 μm in this example. Surface roughness (arithmetic mean roughness Ra) of the first surface 11a of the substrate 11, in the first conductive layer 12 formed on the first surface 11a of the substrate 11 and a fourth conductive layer 21 formed on the second surface 11b of the substrate 11, preferably small from the viewpoint of preventing transmission loss for the high-frequency signal and it is preferably 50 nm or less, in particular 0.1 nm or more and 30 nm or less. The arithmetic mean roughness Ra here is defined by JIS Standard JIS B 0601: 2001. Hereinafter, in the present specification, the surface roughness corresponds to the arithmetic mean roughness Ra.

The first conductive layer 12 includes a first lower conductive layer 121 and a first upper conductive layer 123. The first lower conductive layer 121 is disposed on the first surface 11a of the substrate 11. The first upper conductive layer 123 is disposed above the first lower conductive layer 121. Of the first conductive layer 12, in the vicinity of an edge of the first insulating layer 13, a step 12s is formed along the edge of the first insulating layer 13. By this step 12s is present, the stress on the first insulating layer 13 is alleviated. The detailed structure of the step 12s will be described later.

The first lower conductive layer 121 may be disposed directly on the first surface 11a of the substrate 11, or may be disposed on the first surface 11a of the substrate 11 via at least one layer of a conductive or an insulating layer. For example, by disposing an insulating resin on the first surface 11a of the substrate 11, it is also possible to alleviate the stress generated by differences in a thermal expansion coefficient between the first conductive layer 12 and the substrate 11. Examples of the insulating resin include epoxy, polyimide, polybenzoxazole, and polyamide.

The first lower conductive layer 121 corresponds to a part of a seed layer. The seed layer is a conductive layer that functions as an electrode when the first upper conductive layer 123 is formed by an electrolytic plating. In this example, the first lower conductive layer 121 is a film of copper (Cu), but may be other film such as chrome (Cr), titanium (Ti) film or may be formed of a plurality of films. A thickness of the first lower conductive layer 121 is preferably 20 nm or more and 800 nm or less, and in this example is 200 nm. The first lower conductive layer 121 is formed by electroless plating method.

Further layers may be disposed between the first lower conductive layer 121 and the first surface 11a. For example, an adhesion layer may be disposed to prevent the first lower conductive layer 121 from peeling off from the substrate 11. As the adhesion layer, for example, Zinc Oxide (ZnO) is exemplified. The adhesion layer containing Zinc Oxide is formed by, for example, a sol-gel method.

The first upper conductive layer 123 is formed by an electrolytic plating method using the first lower conductive layer 121 as the seed layer. In this example, the first upper conductive layer 123 is a film of Cu, but may be a film of other conductive materials or may be formed of a plurality of films. The thickness of the first upper conductive layer 123 is preferably 0.5 μm or more and 30 μm or less and is 20 μm in this example.

The first insulating layer 13 is disposed above the first conductive layer 12. In this example, the first insulating layer 13 is a film of silicon nitride (SiN), but may be a film of inorganic materials such as silicon oxide (SiO), silicon oxynitride (SiON), tantalum oxide (TaO), aluminum oxide (AlO), aluminum nitride (AlN), hafnium oxide (HfO), or may be a plurality of films. Relative dielectric constant of the first insulating layer 13 is preferably higher than that of the insulating layer present around the capacitor 100 (e.g., a second insulating layer 22). The relative dielectric constant of the first insulating layer 13 is, for example, 2.0 or more and 9.0 or less, more preferably 5.0 or more and 8.0 or less. The thickness of the first insulating layer 13 is preferably 50 nm or more and 800 nm or less, and is 500 nm in this example. The first insulating layer 13 is formed by chemical vapor deposition (CVD).

The second conductive layer 14 is disposed above the first insulating layer 13. The second conductive layer 14 includes a second lower conductive layer 141 and a second upper conductive layer 143. The second lower conductive layer 141 is disposed above the first insulating layer 13. The second upper conductive layer 143 is disposed above the second lower conductive layer 141.

The second lower conductive layer 141 corresponds to a part of the seed layer. The seed layer is a conductive layer that functions as an electrode when the second upper conductive layer 143 is formed by an electrolytic plating. In this example, the second lower conductive layer 141 is a film of copper (Cu), but may be other film such as chromium (Cr), titanium (Ti), or may be formed of a plurality of films. The thickness of the second lower conductive layer 141 is preferably 20 nm or more and 400 nm or less, and in this example is 200 nm. The second lower conductive layer 141 is formed by electroless plating method.

The second upper conductive layer 143 is formed by electrolytic plating method using the second lower conductive layer 141 as the seed layer. In this example, the second upper conductive layer 143 is a film of Cu, but may be other film of conductive materials or may be formed of a plurality of films. The thickness of the second upper conductive layer 143 is preferably 0.5 μm or more and 5 μm or less and is 2 μm in this example.

The substrate 11 has a through hole 15 penetrates the substrate 11 between the first surface 11a and the second surface 11b. The first conductive layer 12 is electrically connected to the fourth conductive layer 21 disposed on the second surface 11b via a third conductive layer 20 formed in the through hole 15. The third conductive layer 20 is a through electrode penetrating the through hole 15. In this example, the third conductive layer 20 extends continuously from the first conductive layer 12. The third conductive layer 20 includes an outer peripheral portion 201 and an inner peripheral portion 203 in this order from an inner surface 15a side of the through hole 15. The outer peripheral portion 201 is disposed to be connected to the first lower conductive layer 121. The inner peripheral portion 203 is disposed to be connected to the first upper conductive layer 123. In other words, the first lower conductive layer 121 extends continuously to the outer peripheral portion 201, and the first upper conductive layer 123 extends continuously to the inner peripheral portion 203. Another layer, such as the adhesion layer described above, may be further disposed between the outer peripheral portion 201 and the inner surface 15a.

Opening width of the through hole 15 is preferably 40 μm or more and 110 μm or less, and in this example, the width is 80 μm. The opening width of the through hole 15, between the first surface 11a and the second surface 11b, define a figure formed of a cross section of the through hole 15 along these planes, and it refers to the largest distance between any two points of an outer edge of the figure. When the figure formed by the outer edge is a circle, the above-mentioned width refers to diameter of the circle.

As shown in the figure, the through hole 15 has the same opening width between the first surface 11a and the second surface 11b, i.e. a cylindrical shape, it may be other shapes. For example, size of the opening widths may vary between the first surface 11a and the second surface 11b, and may have, for example, minimum, maximum, or minimum and maximum. The opening widths may gradually increase or decrease from the first surface 11a to the second surface 11b.

The through hole 15 is formed by performing etching, laser beam processing, processing by a combination of laser beam processing and etching, sandblasting, electro-discharge machining, drilling, and the like on the substrate 11. The third conductive layer 20 is not limited to a form in which a conductive material is disposed along the side surface of the through hole 15 as shown in FIG. 2, but may be a form in which the through hole 15 is filled with the conductive material. As shown in FIG. 2, the first conductive layer 12, the third conductive layer 20 and the fourth conductive layer 21, at least in part, may be electrically connected to be integral with each other. Further, at least two conductive layers of the first conductive layer 12, the third conductive layer 20 and the fourth conductive layer 21 may be formed of the same material.

The fourth conductive layer 21 includes a fourth lower conductive layer 211 and a fourth upper conductive layer 213 in this order from the second surface 11b side of the substrate 11. The fourth lower conductive layer 211 is disposed to be connected with the outer peripheral portion 201. The fourth upper conductive layer 213 is disposed to be connected with the inner peripheral portion 203. Another layer, such as the adhesion layer described above, may be further disposed between the fourth lower conductive layer 211 and the second surface 11b. The first conductive layer 12 and the fourth conductive layer 21 is formed of the same material, and may have substantially the same thickness. In such cases, resistance value is less likely to differ in a connection part when electrically connected, it is possible to reduce the transmission loss of the signal.

On the first surface 11a side and the second surface 11b side of the substrate 11, the second insulating layer 22, which is an example of the insulating layer is formed. The second insulating layer 22, in this example, is a layer containing a resin which is the organic material. In the second insulating layer 22, at positions corresponding to the first conductive layer 12, the second conductive layer 14 and the fourth conductive layer 21, via holes 23 are formed. A connection part 24 formed of a conductive material is disposed in each of the via holes 23. The connection part 24 is electrically connected to the conductive layer disposed at the bottom of the via hole 23.

The interposer 10 is electrically connected to a semiconductor chip 50 via the connection part 24. The interposer 10 is connected to a circuit substrate 40 via a solder ball 25 and the connection part 24. The semiconductor chip 50 may also be connected to the connection part 24 via the solder ball 25. According to this configuration, a semiconductor device including the interposer 10, the semiconductor chip 50 which is disposed on the first surface 11a side of the substrate 11 and electrically connected to the third conductive layer 20, and the circuit substrate 40 which is disposed on the second surface 11b side of the substrate 11 and electrically connected to the third conductive layer 20 is provided. According to the interposer 10 of the present embodiment, it is simplified to implement the semiconductor chip 50 of narrow terminal pitch to the large circuit substrate 40. The circuit substrate 40 may be, for example, a motherboard.

[2. Step]

Subsequently, of the capacitor 100, a detailed structure in the vicinity of the step 12s will be described. The first conductive layer 12 includes a first part 12-1 which is a region in contact with the first insulating layer 13, and a second part 12-2 which is a region apart from the first insulating layer 13. That is, an upper surface 12-1u of the first part 12-1 contacts the first insulating layer 13. On the other hand, an upper surface 12-2u of the second part 12-2 is apart from the first insulating layer 13. The surface roughness of the upper surface 12-2u is equivalent to the surface roughness of the upper surface 12-1u, or larger than the surface roughness of the upper surface 12-1u. In this example, the surface roughness of the upper surface 12-1u is 200 nm or less, the surface roughness of the upper surface 12-2u is 80 nm or more and 300 nm or less. By the surface roughness of the upper surface 12-1u in contact with the first insulating layer 13 of the first conductive layer 12 is small, in the capacitor 100, dielectric breakdown in the first insulating layer 13 is less likely to occur. On the other hand, since the surface roughness of the upper surface 12-2u is large, the adhesiveness to the second insulating layer 22 is improved, which is preferable.

Reference letter t1 corresponds to the thickness of the first part 12-1, i.e., the distance from the first surface 11a of the substrate 11 to the upper surface 12-1u. Reference letter t2 corresponds to the thickness of the second part 12-2, i.e., the distance from the first surface 11a of the substrate 11 to the upper surface 12-2u. The second part 12-2 is thinner than the first part 12-1 (t1>t2). Reference letter ts corresponds to the difference between t1 and t2 (t1−t2). In other words, ts corresponds to the difference in height between the upper surface 12-1u and the upper surface 12-2u, i.e. the magnitude of the step 12s. Reference letter t3 corresponds to the thickness of the first lower conductive layer 121. As described above, t1 corresponds to the thickness of the first conductive layer 12, corresponds to the thickness obtained by adding the thickness t3 of the first lower conductive layer 121 and the thickness of the first upper conductive layer 123. Here, focusing on the first upper conductive layer 123 formed of a film of the same material in the first insulating layer 13 side of the first conductive layer 12. In this case, the thickness of the first upper conductive layer 123 in the first part 12-1 corresponds to "t1−t3", the thickness of the first upper conductive layer 123 in the second part 12-2 corresponds to "t2−t3". Therefore, it can be said that the first upper conductive layer 123 in the second part 12-2 is thinner than the first upper conductive layer 123 in the first part 12-1. As described above, in this example, t3 is 0.4 μm, the thickness of the first upper conductive layer 123 is 20 μm. Thus, t1 is 20.4 μm. In this example, t2 is 20.1 μm and ts is 0.3 μm.

Reference letter d1 corresponds to the distance between a side surface 14e of the second conductive layer 14 and a side surface 13e of the first insulating layer 13. Reference letter d2 corresponds to the distance between a border 12-1p and the side surface 13e. The border 12-1p is a border between the first part 12-1 and the second part 12-2 is disposed between the first insulating layer 13 and the substrate 11. Reference letter d3 corresponds to the distance between a side surface 12-2e of the second part 12-2 and the border 12-1p. The distance d1, d2, d3 correspond to the distance when viewed perpendicular to the surface of the substrate 11 (the first surface 11a), i.e., the distance when viewed along the normal direction of the surface of the substrate 11.

In this example, d1 is 10 μm, d2 is 0.2 μm, and d3 is 10 μm. d1, corresponding to the distance between the first conductive layer 13 and the second insulating layer 14 required depending on the alignment accuracy of the lithography tool when forming the second conductive layer 14, or the distance required to prevent a short circuit between the first conductive layer 12 and the second conductive layer 14, may be larger than 10 μm, may be small. When d1 is reduced, the side surface 13e and the side surface 14e are substantially coincident with each other, and d1 may become 0 μm. The case where d1 becomes 0 μm will be further described in an embodiment described later. d2 is preferably smaller than ts and may be 0 μm in some cases. d3 may be more than or less than 10 μm. However, d3 does not become 0 μm. d3 is preferably larger than ts and is preferably larger than d1. d3 is preferably 10% or more, more preferably 30% or more, of t1.

The border 12-1p, the side surface 12-2e, the side surface 13e and the side surface 14e, when viewed perpendicular to the surface of the substrate 11, respectively correspond to an edge of the first part 12-1, an edge of the second part 12-2, an edge of the first insulating layer 13 and an edge of the second conductive layer 14. The border 12-1p can also be said to be the outermost position contacting the first insulating layer 13 of the first conductive layer 12. When the side surface of the second part 12-2 has an inclination, the position of the side surface 12-2e is defined as the outermost position of the second part 12-2. When the side surface of the second conductive layer 14 has an inclination, the position of the side surface 14e is defined as a position in contact with the first insulating layer 13. When the side surface of the first insulating layer 13 has an inclination, the position of the side surface 13e is defined as the outermost position of the first insulating layer 13.

[3-1. Manufacturing Method of Interposer]

Next, a manufacturing method of the interposer 10 will be described.

Figure 5:
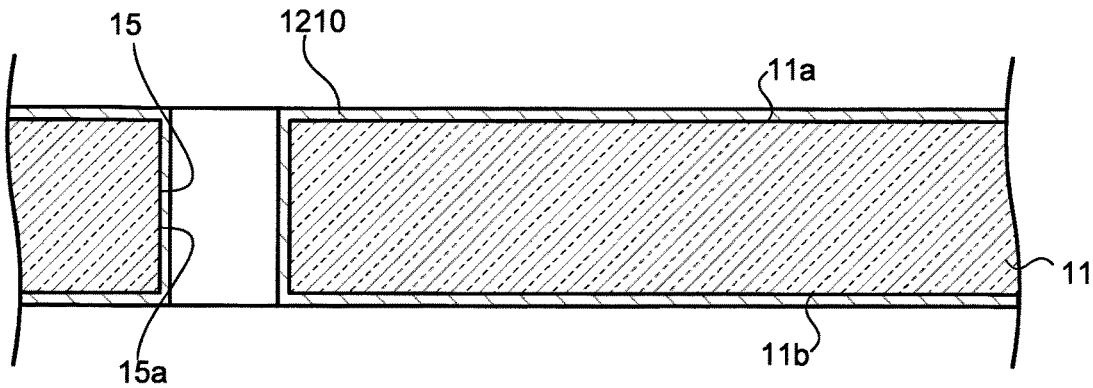
FIG. 5 is a diagram illustrating a manufacturing method of the interposer according to the first embodiment of the present disclosure.

FIGS. 5 to 9 are diagrams illustrating a manufacturing method of an interposer according to the first embodiment of the present disclosure. FIGS. 5 to 9 show the cross-sectional shape of the part corresponding to FIG. 2 (A-A line cross-sectional view in FIG. 1). First, the substrate 11 having the first surface 11a and the second surface 11b and having the through hole 15 penetrating the first surface 11a and the second surface 11b is prepared. As shown in FIG. 5, on the first surface 11a and the second surface 11b of the substrate 11, and on the inner surface 15a of the through hole 15, a seed layer 1210 is formed by electroless plating method. As described above, an adhesion layer may be formed before forming the seed layer 1210.

Figure 6:
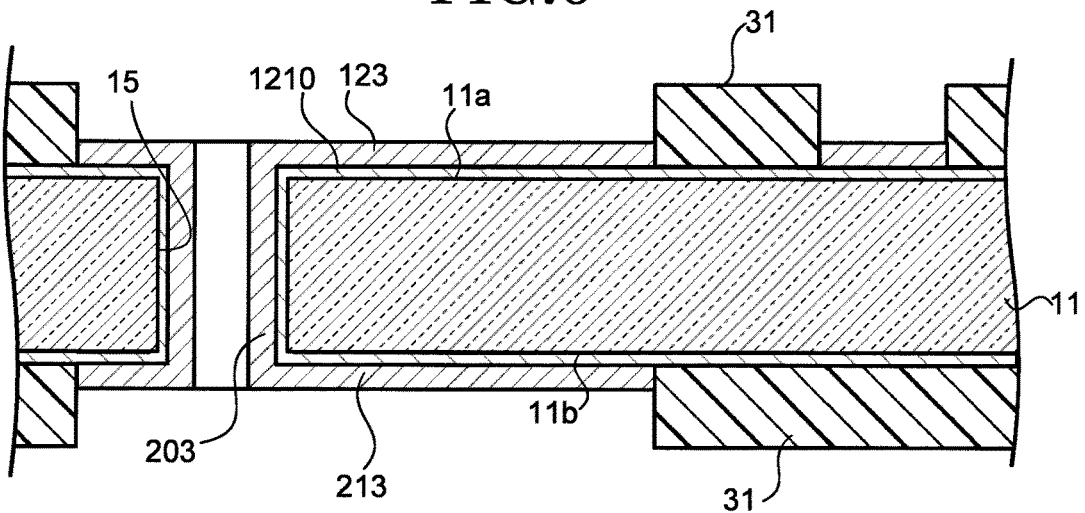
FIG. 6 is a diagram illustrating the manufacturing method of the interposer according to the first embodiment of the present disclosure.
Figure 7:
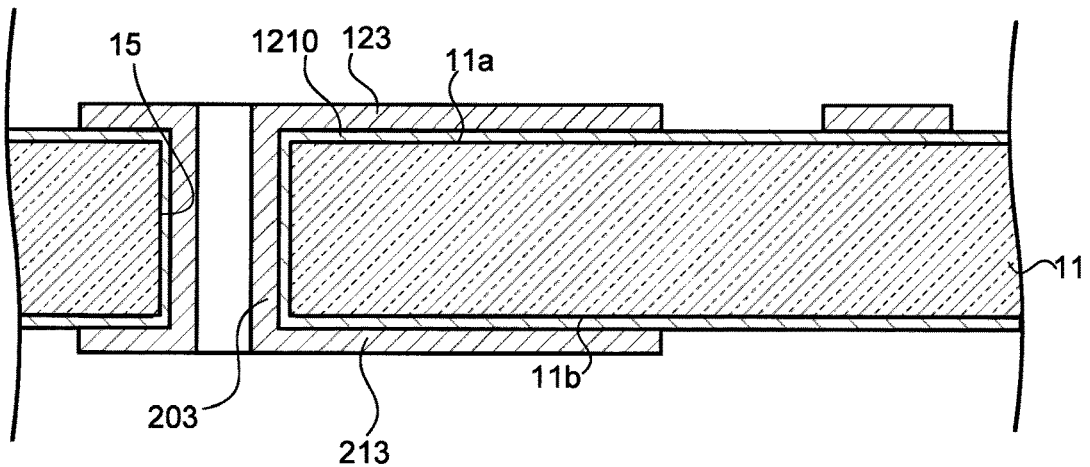
FIG. 7 is a diagram illustrating the manufacturing method of the interposer according to the first embodiment of the present disclosure.

As shown in FIG. 6, a resist layer 31 is formed on a part of the seed layer 1210. By electrolytic plating method, a conductive layer is formed in a part exposed from the resist layer 31 of the seed layer 1210. Thus, the first upper conductive layer 123 is formed in the first surface 11a side, the inner peripheral portion 203 is formed in the through hole 15, and the fourth upper conductive layer 213 is formed in the second surface 11b side. Thereafter, as shown in FIG. 7, the resist layer 31 is removed.

Figure 8:
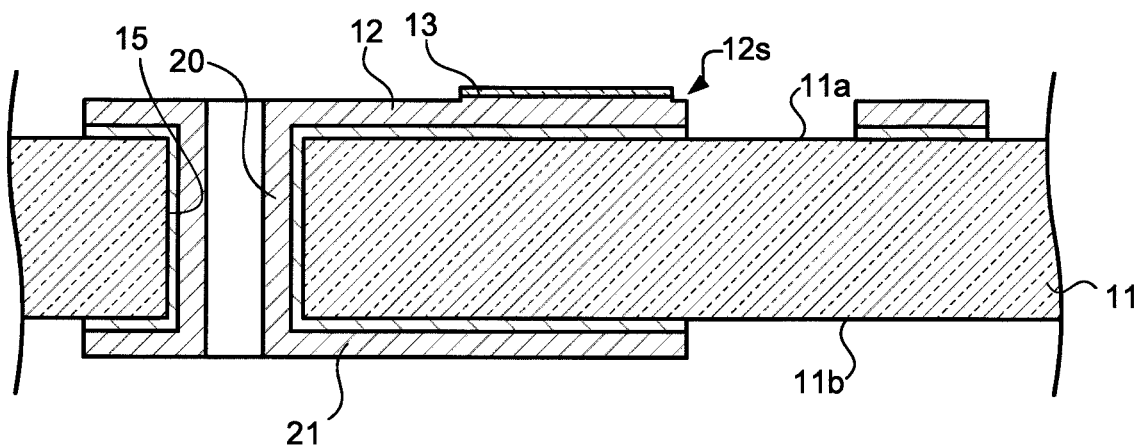
FIG. 8 is a diagram illustrating the manufacturing method of the interposer according to the first embodiment of the present disclosure.
Figure 9:
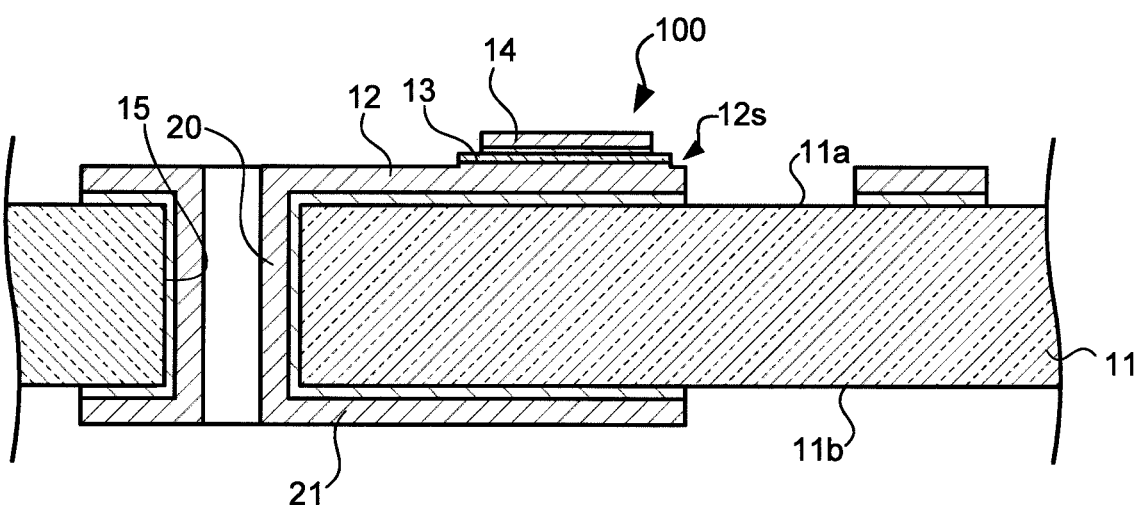
FIG. 9 is a diagram illustrating the manufacturing method of the interposer according to the first embodiment of the present disclosure.

As shown in FIG. 8, the first insulating layer 13 is formed, and at that time, the exposed part of the seed layer 1210 is removed. Thus, each of the conductive layers is apart from each other, the first conductive layer 12 is formed in the first surface 11a side, the third conductive layer 20 is formed in the through hole 15, and the fourth conductive layer 21 is formed in the second surface 11b side. Subsequently, as shown in FIG. 9, the second conductive layer 14 is formed on the first insulating layer 13. Thus, it is possible to constitute a capacitor including the first conductive layer 12, the first insulating layer 13 on the first conductive layer 12, and the second conductive layer 14 on the first insulating layer 13. In the manufacturing method from FIG. 7 to FIG. 9, detail of a manufacturing method of a portion to be the capacitor 100 will be described later.

Thereafter, the second insulating layer 22 is formed, the via hole 23 is formed, and the connection part 24 is formed to realize the configuration shown in FIG. 2. The thickness of the second insulating layer 22 (the distance from the first surface 11a of the substrate 11 to the surface of the second insulating layer 22 in the example of FIG. 2) is preferable to have a laminated thickness or more and 2 times or less of the laminated thickness in order to planarize the unevenness of the surface of the capacitor 100 or like. The laminated thickness is the thickness of the structure in which the first conductive layer 12, the first insulating layer 13 and the second conductive layer 14 are laminated. Further, in the vicinity of the capacitor 100, although capacitive components between the first conductive layer 12 and the connection part 24 occurs, it is desired to be as small as possible in designing. Therefore, between the first conductive layer 12 and the connection part 24, it is preferable to form the thicker second insulating layer 22 having a lower relative dielectric constant than the first insulating layer 13. Of the thickness of the second insulating layer 22, the distance from the surface of the first insulating layer 13 to the surface of the second insulating layer 22 is, for example, preferably 10 times or more of the thickness of the first insulating layer 13.

[3-2. Manufacturing Method of Capacitor]

Of the above-described manufacturing method from FIG. 7 to FIG. 9, a portion in which the capacitor 100 is manufactured will be described in more detail referring to FIGS. 10 to 15.

Figure 10:
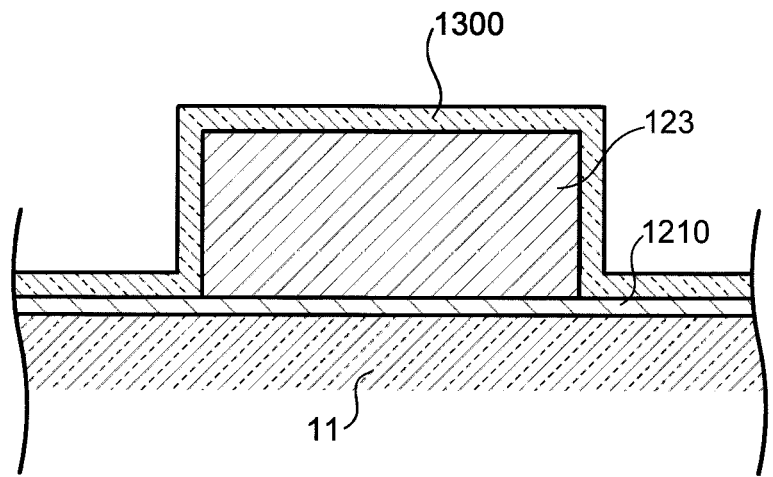
FIG. 10 is a diagram illustrating the manufacturing method of the capacitor according to the first embodiment of the present disclosure.

FIGS. 10 to 15 are diagrams illustrating a method of manufacturing a capacitor according to the first embodiment of the present disclosure. FIGS. 10 to 15 show the cross-sectional shape of the part corresponding to FIG. 3 (B-B line cross-sectional view in FIG. 1). As shown in FIG. 10, after the state shown in FIG. 7, an insulating layer 1300 is formed to cover the first upper conductive layer 123. Prior to forming the insulating layer 1300, surface treatment may be performed to expose the surface including the first upper conductive layer 123 to plasma, such as $NH_3$ plasma. This removes the oxide on the surface of the first upper conductive layer 123 and may increase the adhesion between the first upper conductive layer 123 and the insulating layer 1300.

Figure 11:
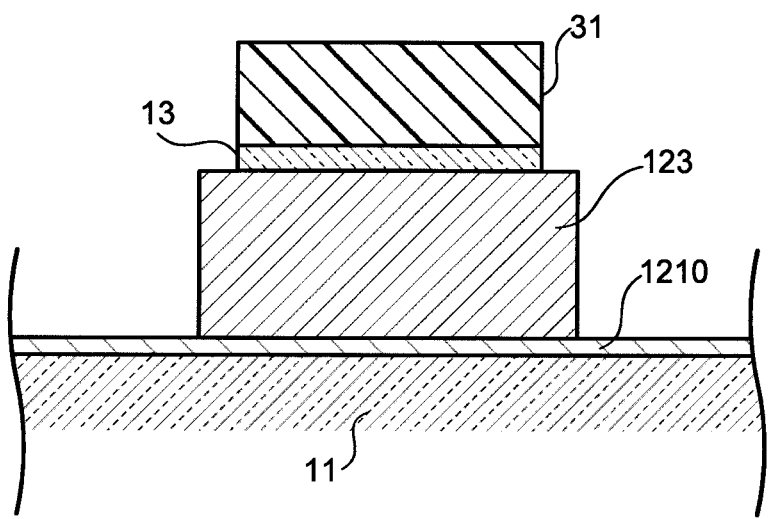
FIG. 11 is a diagram illustrating the manufacturing method of the capacitor according to the first embodiment of the present disclosure.

Subsequently, the resist layer 31 is formed, and a part of the insulating layer 1300 that is not covered by the resist layer 31 is removed to form the first insulating layer 13 as shown in FIG. 11. Thereafter, the resist layer 31 is removed. Prior to forming the insulating layer 1300, the resist layer 31 may be formed except for the part where the first insulating layer 13 is formed. In this case, after forming the insulating layer 1300, a part of the insulating layer 1300 may be lifted off to form the first insulating layer 13 by removing the resist layer 31 by wet etching.

Figure 12:
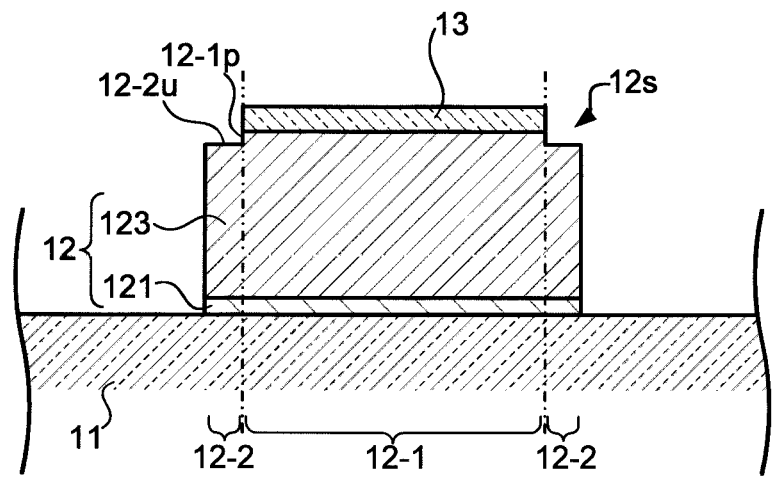
FIG. 12 is a diagram illustrating the manufacturing method of the capacitor according to the first embodiment of the present disclosure.

Next, as shown in FIG. 12, a part of the first upper conductive layer 123 exposed from the first insulating layer 13 is removed to form the step 12s. At this time, the seed layer 1210 exposed from the first upper conductive layer 123 is also removed. That is, of the first conductive layer 12, the upper surface 12-2u of the second part 12-2 is formed outside the border 12-1p.

Figure 13:
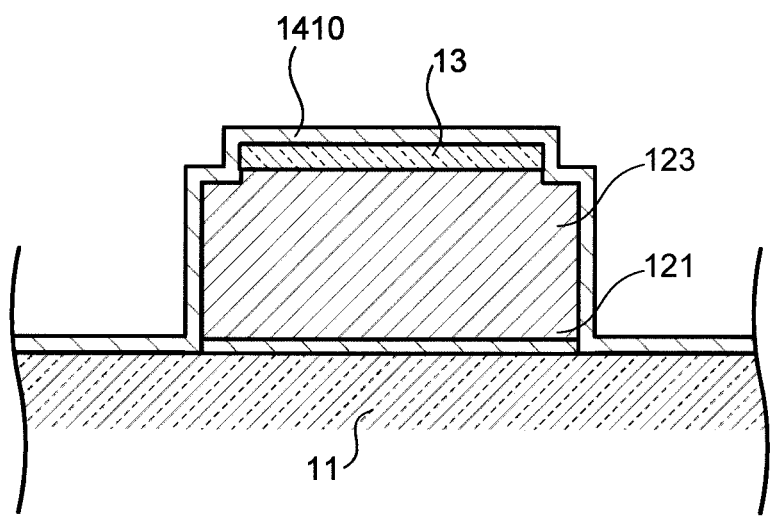
FIG. 13 is a diagram illustrating the manufacturing method of the capacitor according to the first embodiment of the present disclosure.
Figure 14:
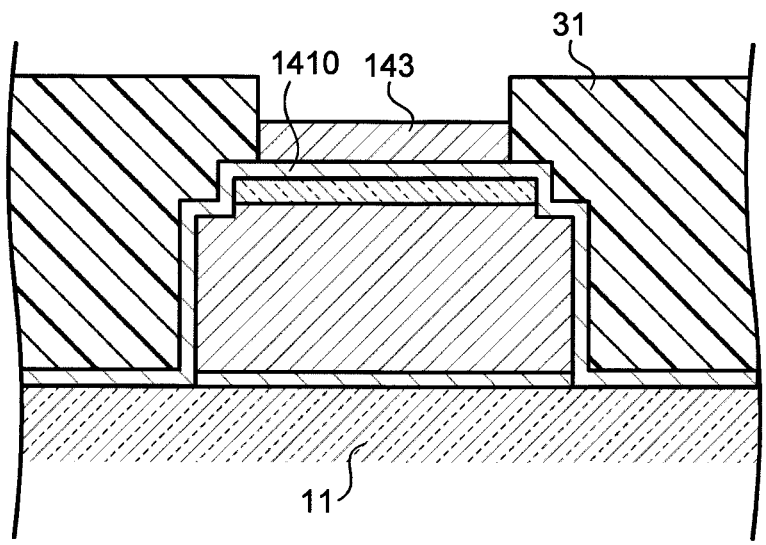
FIG. 14 is a diagram illustrating the manufacturing method of the capacitor according to the first embodiment of the present disclosure.
Figure 15:
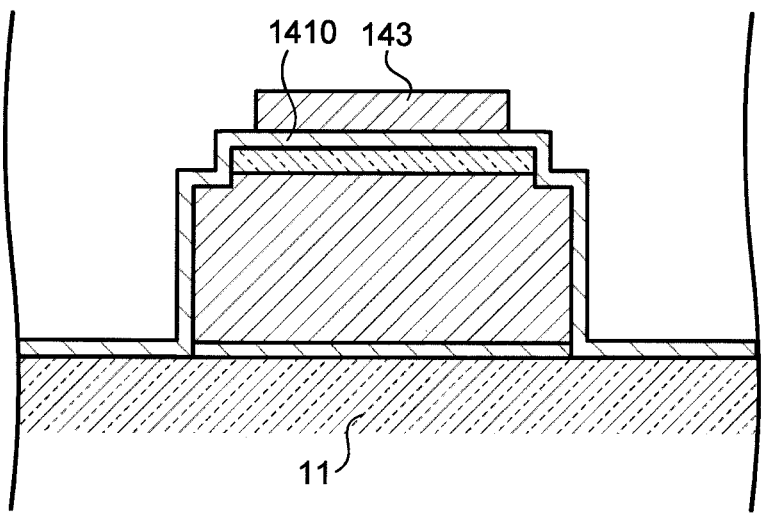
FIG. 15 is a diagram illustrating the manufacturing method of the capacitor according to the first embodiment of the present disclosure.

Subsequently, as shown in FIG. 13, a seed layer 1410 is formed. Then, the resist layer 31 is formed on a part of the seed layer 1410 as shown in FIG. 14, and a conductive layer is formed on a part of the seed layer 1410 exposed from the resist layer 31 by electrolytic plating method. Thus, the second upper conductive layer 143 is formed. Thereafter, as shown in FIG. 15, the resist layer 31 is removed. In this condition, by removing the seed layer 1410 except for the part covered by the second upper conductive layer 143, the capacitor 100 shown in FIG. 9 is realized.

[4. Stress Comparison]

The capacitor 100 described above, the stress received by the first insulating layer 13 by the step 12s is reduced. Here, the stress distribution was compared by the simulation under the predetermined setting condition for a capacitor which does not include the step 12s and the capacitor 100 which includes the step 12s.

Figure 16:
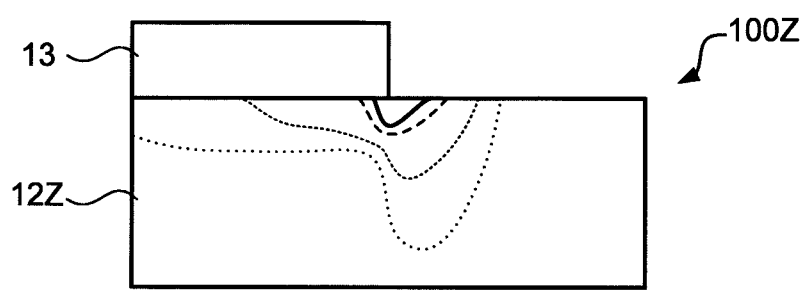
FIG. 16 is a diagram illustrating stress distribution of a first conductive layer of the capacitor in a comparative example.
Figure 17:
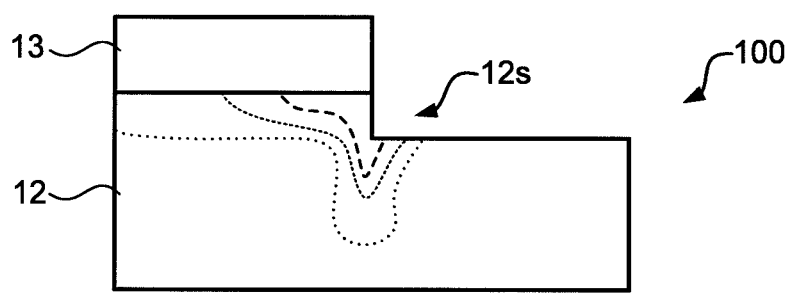
FIG. 17 is a diagram illustrating stress distribution of a first conductive layer of the capacitor according to the first embodiment of the present disclosure.

FIG. 16 is a diagram illustrating stress distribution of the first conductive layer of the capacitor in the comparative example. FIG. 17 is a diagram illustrating stress distribution of the first conductive layer of the capacitor according to the first embodiment of the present disclosure. FIGS. 16 and 17 show stress distribution given to the first insulating layer 13 in the first conductive layer, showing the distribution by contour lines. The same type of contour line in FIG. 16 and FIG. 17 indicates the same magnitude of stress. The stress become higher in the order of dotted lines, broken lines, and solid lines in the line type. Comparing FIG. 16 and FIG. 17, in comparison with a capacitor 100Z of the comparative example shown in FIG. 16, in the capacitor 100 shown in FIG. 17, the stress was alleviated by the presence of the step 12s.

[5. Another Manufacturing Method]

Manufacturing method of the capacitor 100 is not limited to the method described above. An example of another manufacturing method will be described.

Figure 18:
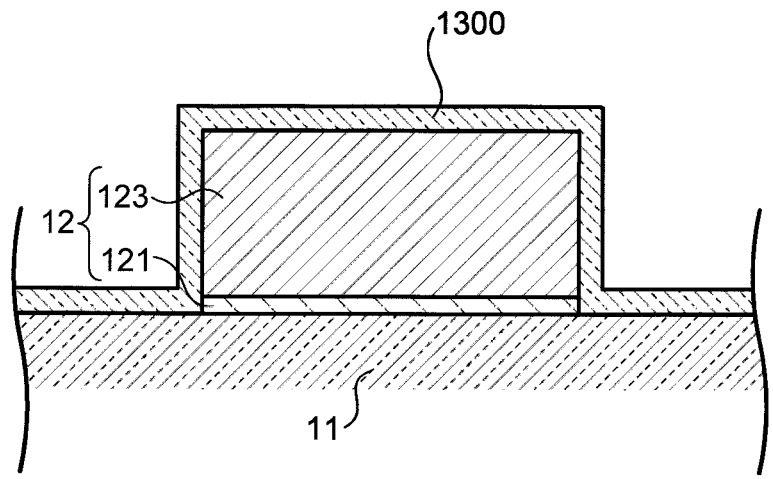
FIG. 18 is a diagram illustrating another manufacturing method of the capacitor according to the first embodiment of the present disclosure.
Figure 19:
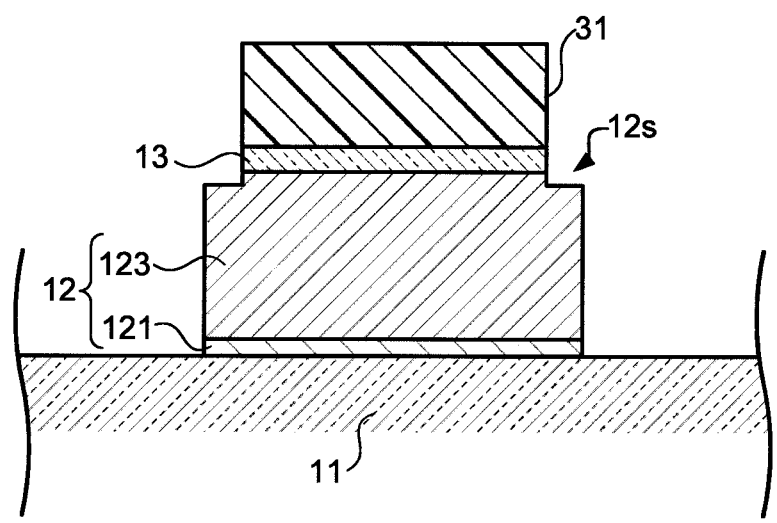
FIG. 19 is a diagram illustrating another manufacturing method of the capacitor according to the first embodiment of the present disclosure.

FIGS. 18 and 19 are diagrams illustrating another manufacturing method of the capacitor according to the first embodiment of the present disclosure. The above-described example differs in the timing of removing the seed layer 1210. As shown in FIG. 18, in the state shown in FIG. 7, after forming the first lower conductive layer 121 by removing the seed layer 1210 except for the part covered by the first upper conductive layer 123, the insulating layer 1300 is formed to cover the first conductive layer 12. Subsequently, the resist layer 31 is formed, the part of the insulating layer 1300 that is not covered by the resist layer 31 is removed, and the first insulating layer 13 is formed as shown in FIG. 19. Furthermore, of the first upper conductive layer 123, the step 12s is formed by removing a part of the portion exposed from the first insulating layer 13. As a result, the capacitor 100 having the same structure as that shown in FIG. 12 is formed.

Second Embodiment

In the second embodiment, a capacitor 100A in which the second conductive layer 14 of the capacitor 100 in the first embodiment is shared with the connection part 24 is exemplified. The capacitor 100A has the structure shown in FIG. 23. A manufacturing method of the capacitor 100A will be described referring to FIGS. 20 to 23.

Figure 20:
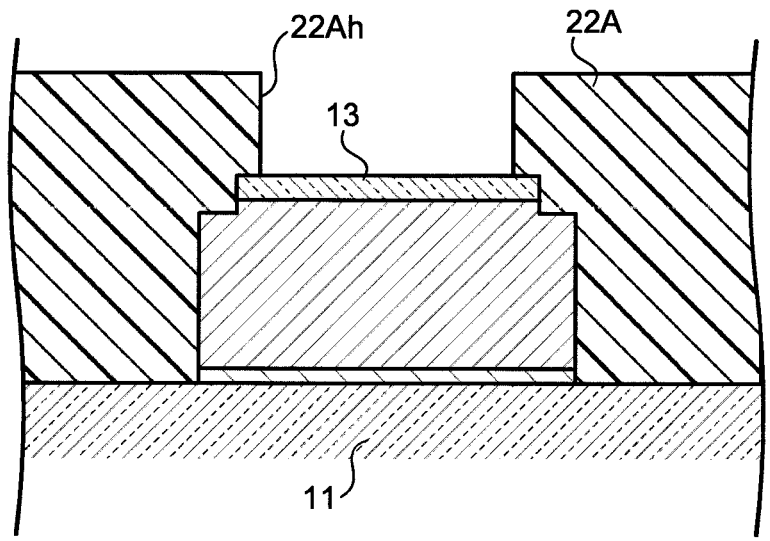
FIG. 20 is a diagram illustrating a manufacturing method of a capacitor according to a second embodiment of the present disclosure.
Figure 21:
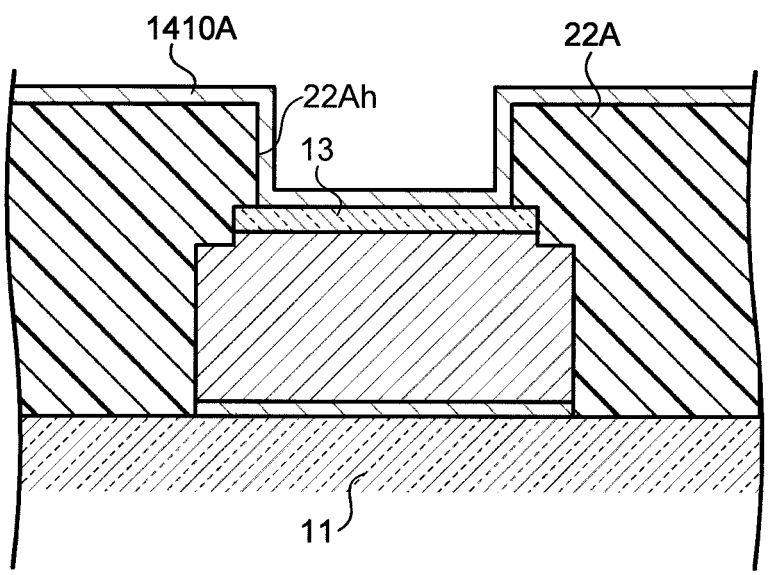
FIG. 21 is a diagram illustrating a manufacturing method of the capacitor according to the second embodiment of the present disclosure.
Figure 22:
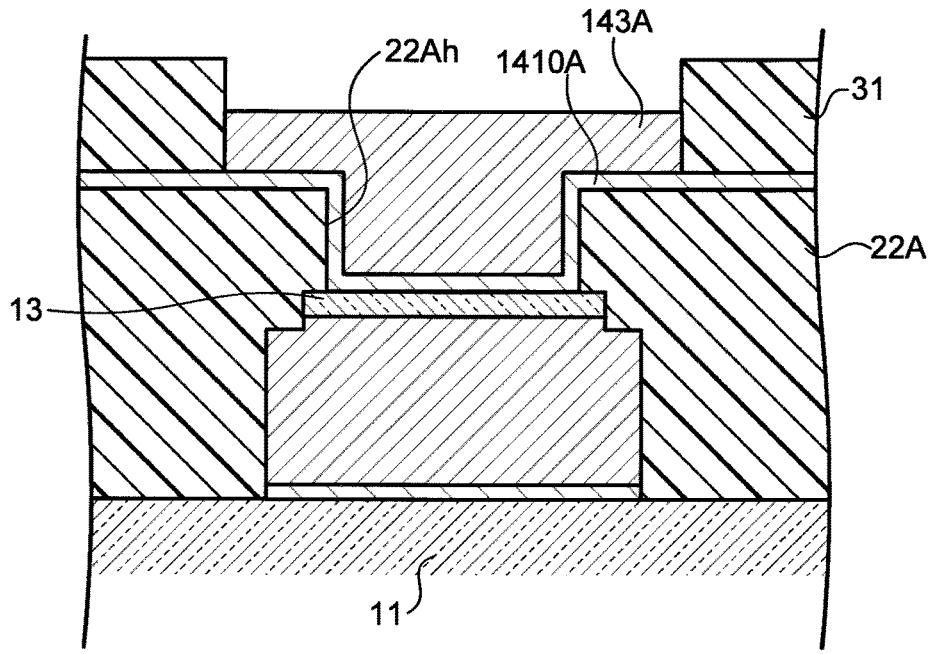
FIG. 22 is a diagram illustrating a manufacturing method of the capacitor according to the second embodiment of the present disclosure.
Figure 23:
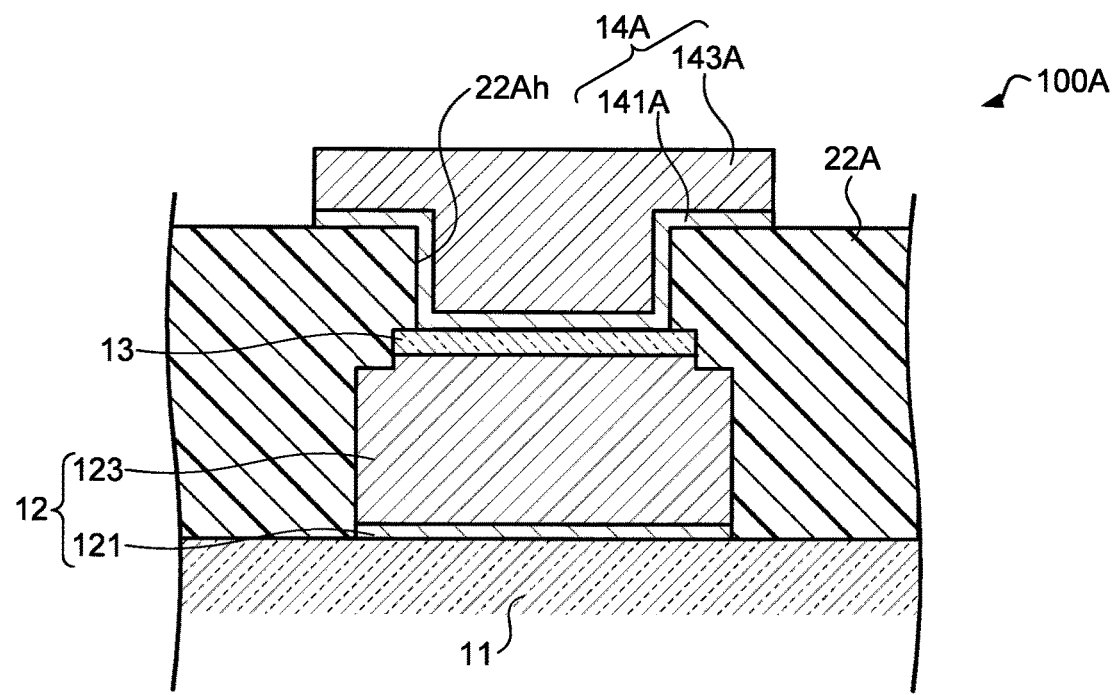
FIG. 23 is a diagram illustrating a manufacturing method of the capacitor according to the second embodiment of the present disclosure.

FIGS. 20 to 23 are diagrams illustrating a manufacturing method of the capacitor according to the second embodiment of the present disclosure. In the state shown in FIG. 8, as shown in FIG. 20, a second insulating layer 22A including an opening 22Ah is formed. The opening 22Ah is formed simultaneously with the via hole 23 shown in FIG. 2 and has a similar structure, but differs in that it is formed to expose a part of the first insulating layer 13. Next, as shown in FIG. 21, a seed layer 1410A is formed. The seed layer 1410A is formed over the first insulating layer 13 and the second insulating layer 22A. As shown in FIG. 22, the resist layer 31 is formed, and a second upper conductive layer 143A is formed by electrolytic plating method. Finally, as shown in FIG. 23, a second lower conductive layer 141A is formed by removing the resist layer 31 and removing the seed layer 1410A except for the part covered with the second upper conductive layer 143A. A second conductive layer 14A formed in this way is formed with the connection part 24. The opening 22 Ah and the via hole 23 may be formed at different timings. The second conductive layer 14A and the connection part 24 may be formed at different timings.

According to the structure of the capacitor 100A, it can be said that it has the following structure. The second conductive layer 14A contacts an inner surface of the opening 22Ah. The second insulating layer 22A is disposed in a part between the second conductive layer 14A and the first insulating layer 13. That is, a part of the second conductive layer 14A is in contact with a part of the first insulating layer 13.

Third Embodiment

In the first embodiment, the second part 12-2 is disposed to surround the first part 12-1 of the first conductive layer 12. That is, the edge of the first insulating layer 13 is all disposed on the first conductive layer 12. In the third embodiment, a capacitor in which at least a part of the edge of the first insulating layer 13 is disposed outside the first conductive layer 12 will be described.

Figure 4:
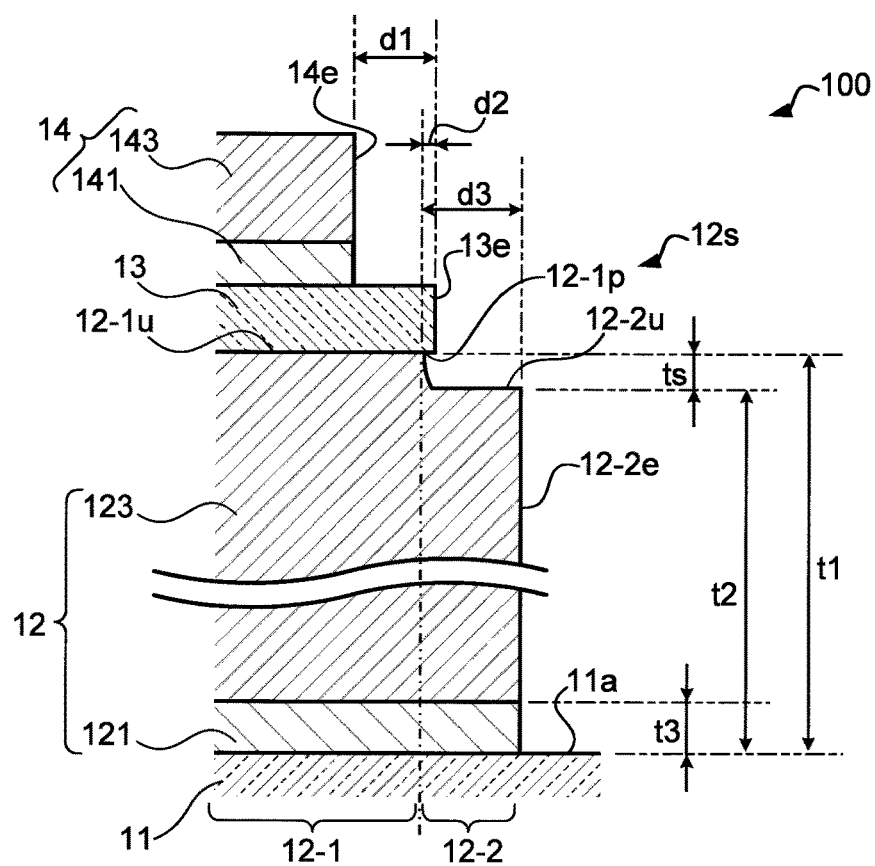
FIG. 4 is an enlarged view of vicinity of a step of the capacitor according to the first embodiment of the present disclosure.
Figure 24:
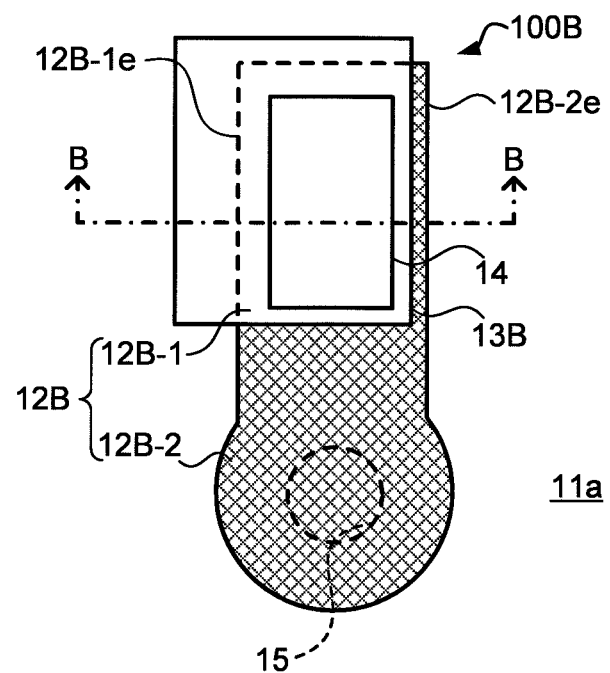
FIG. 24 is a schematic plan view showing an interposer according to the third embodiment of the present disclosure.
Figure 25:
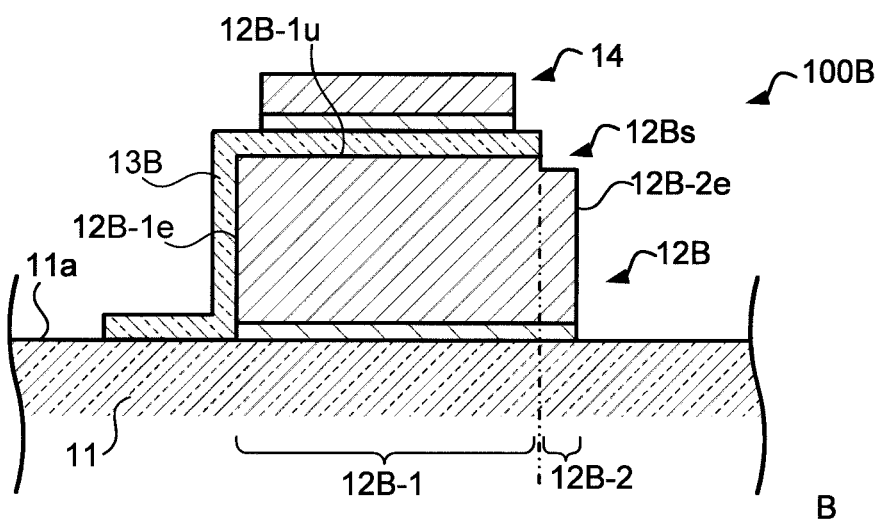
FIG. 25 is a schematic cross-sectional view (B-B line cross-sectional view of FIG. 24) showing a capacitor included in the interposer according to a third embodiment of the present disclosure.

FIG. 24 is a schematic plan view showing the interposer according to the third embodiment of the present disclosure. FIG. 25 is a schematic cross-sectional view (B-B line cross-sectional view of FIG. 24) showing a capacitor included in the interposer according to the third embodiment of the present disclosure. The first conductive layer 12 in the first embodiment, as shown in FIG. 1, since it surrounds the periphery of the first part 12-1, the edge of the second part 12-2 (corresponding to the side surface 12-2e shown in FIG. 4) and the edge of the first conductive layer 12 are common.

As shown in FIG. 24, in a capacitor 100B, a part of a first insulating layer 13B extends to an outside of a first conductive layer 12B. Therefore, the side surface of the first conductive layer 12B (outer edge when viewed along the normal direction of the surface (the first surface 11a) of the substrate 11) includes both a side surface 12B-2e corresponding to the edge of the second part 12B-2, and a side surface 12B-1e corresponding to the edge of the first part 12B-1. As shown in FIG. 25, the first insulating layer 13B covers an upper surface 12B-1u, the side surface 12B-1e, and further covers a part of the first surface 11a of the substrate 11. Thus, even by a configuration in which a part of an end of the first insulating layer 13B is present on the first conductive layer 12B, since the step 12Bs is present in the end, similarly to the embodiment described above, stress given to the first insulating layer 13B by the first conductive layer 12B is reduced. On the other hand, the stress is not concentrated in a region where the end of the first insulating layer 13B does not exist on the first conductive layer 12B, the first insulating layer 13B is less likely to crack on the first conductive layer 12B.

Of the first insulating layer 13B, the thickness of the part covering the side surface 12B-1e may be smaller than the thickness of the part covering the upper surface 12B-1u. At this time, the thickness of the first insulating layer 13B of the part covering the side surface 12B-1e may be 30% or more and 90% or less, and 60% or more and 80% or less relative to the thickness of the first insulating layer 13B of the part covering the upper surface 12B-1u.

Fourth Embodiment

In the fourth embodiment, an example in which a part of the second conductive layer 14 in the capacitor 100B of the third embodiment further extends to the outside of the first conductive layer 12B will be described.

Figure 26:
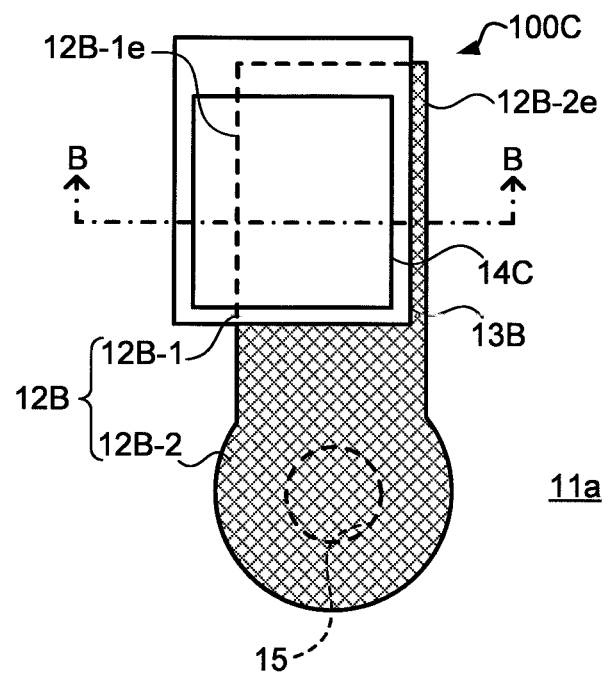
FIG. 26 is a schematic plan view showing an interposer according to a fourth embodiment of the present disclosure.
Figure 27:
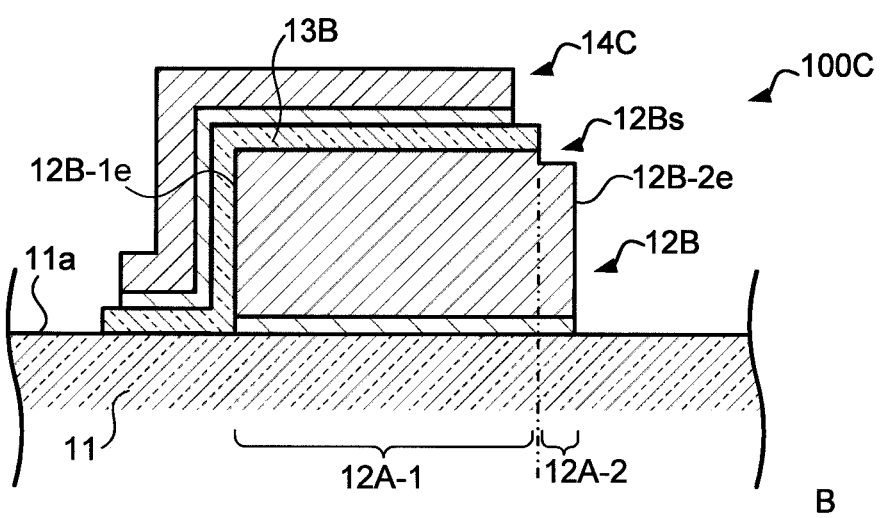
FIG. 27 is a schematic cross-sectional view (B-B line cross-sectional view of FIG. 26) showing a capacitor included in an interposer according to the fourth embodiment of the present disclosure.

FIG. 26 is a schematic plan view showing an interposer according to the fourth embodiment of the present disclosure. FIG. 27 is a schematic cross-sectional view (B-B line cross-sectional view of FIG. 26) showing a capacitor included in the interposer according to the fourth embodiment of the present disclosure. According to a capacitor 100C shown in FIG. 26, a second conductive layer 14C is formed along the arrangement of the first insulating layer 13B. Therefore, the first insulating layer 13B has a region sandwiched between the second conductive layer 14C and the side surface 12B-1e of the first part 12B-1, and further, a region sandwiched between the second conductive layer 14C and the substrate 11.

Fifth Embodiment

In the fifth embodiment, an example in which a plurality of capacitors 100C in which a part of the second conductive layer 14C as in the fourth embodiment described above extends to the outside of the first conductive layer 12B are connected with each other via the second conductive layer 14C will be described.

Figure 28:
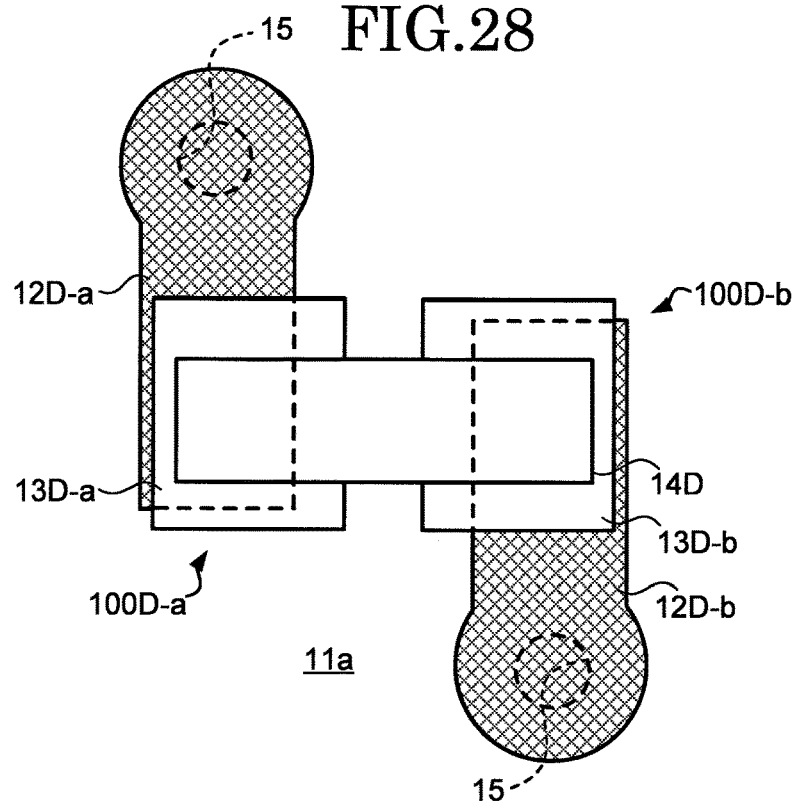
FIG. 28 is a schematic plan view showing an interposer according to a fifth embodiment of the present disclosure.

FIG. 28 is a schematic plan view showing an interposer according to the fifth embodiment of the present disclosure. Each of a first capacitor 100D-a and a second capacitor 100D-b in the fifth embodiment has a configuration similar to that of the capacitor 100C in the fourth embodiment. The first capacitor 100D-a includes a first conductive layer 12D-a, a first insulating layer 13D-a, and a second conductive layer 14D. The second capacitor 100D-b includes a first conductive layer 12D-b, a first insulating layer 13D-b, and the second conductive layer 14D. The second conductive layer 14D is disposed as a common electrode in the first capacitor 100D-a and the second capacitor 100D-b.

Although the first capacitor 100D-a and the second capacitor 100D-b are disposed in rotational symmetry in this example, they may be disposed in line symmetry or may be disposed in a form having no symmetry. In any case, it is assumed that the first capacitor 100D-a and the second capacitor 100D-b are adjacent to each other. The first conductive layer 12D-a is apart from the first conductive layer 12D-b. The first insulating layer 13D-a is apart from the first insulating layer 13D-b. The second conductive layer 14D, in a region except for the region contacting the first insulating layers 13D-a, 13D-b, further contacts the first surface 11a of the substrate 11.

Sixth Embodiment

In the sixth embodiment, an example in which the first insulating layer 13D-a is not apart from the first insulating layer 13D-b in the fifth embodiment described above will be described.

Figure 29:
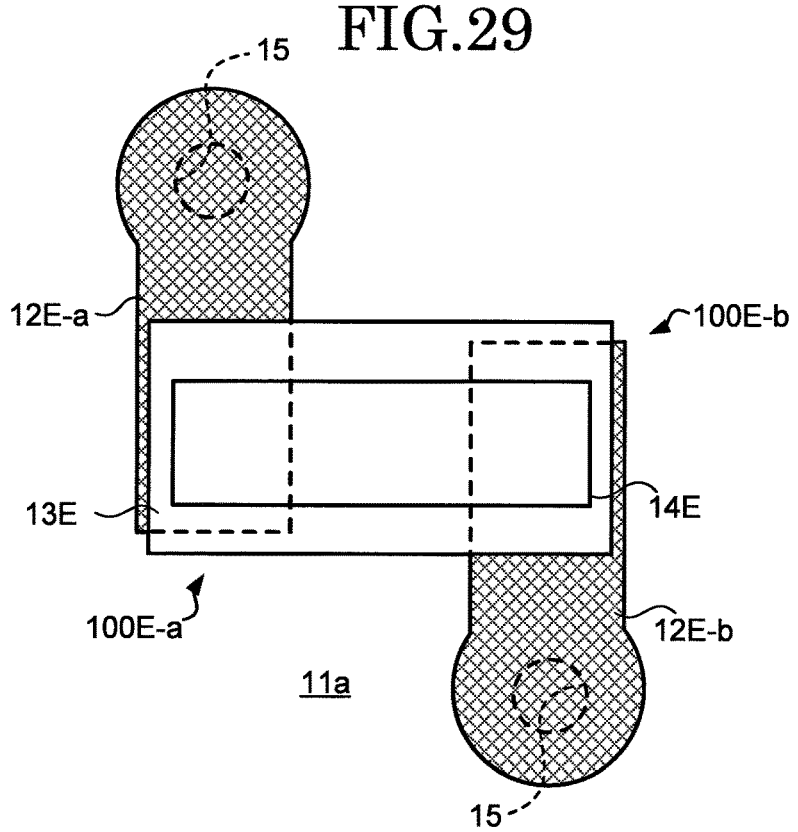
FIG. 29 is a schematic plan view showing an interposer according to a sixth embodiment of the present disclosure.

FIG. 29 is a schematic plan view showing an interposer according to the sixth embodiment of the present disclosure. Each of a first capacitor 100E-a and a second capacitor 100E-b in the sixth embodiment has a configuration similar to that of the first capacitor 100D-a and the second capacitor 100D-b in the fifth embodiment. The first capacitor 100E-a includes a first conductive layer 12E-a, a first insulating layer 13E, and a second conductive layer 14E. The second capacitor 100E-b includes a first conductive layer 12E-b, the first insulating layer 13E, and the second conductive layer 14E. The first insulating layer 13E is disposed as a common insulating layer in the first capacitor 100E-a and the second capacitor 100E-b. The second conductive layer 14E is disposed as a common electrode in the first capacitor 100E-a and the second capacitor 100E-b. Although the first capacitor 100E-a and the second capacitor 100E-b are disposed in rotational symmetry in this example, they may be disposed in line symmetry or may be disposed in a form having no symmetry. In any case, it is assumed that the first capacitor 100E-a and the second capacitor 100E-b are adjacent to each other. The first conductive layer 12E-a is apart from the first conductive layer 12E-b.

Seventh Embodiment

Although in the fifth and sixth embodiments, the second conductive layers in the plurality of capacitors are disposed as the common electrode. In the seventh embodiment, an example in which the first conductive layers in the plurality of capacitors are disposed as the common electrode will be described.

Figure 30:
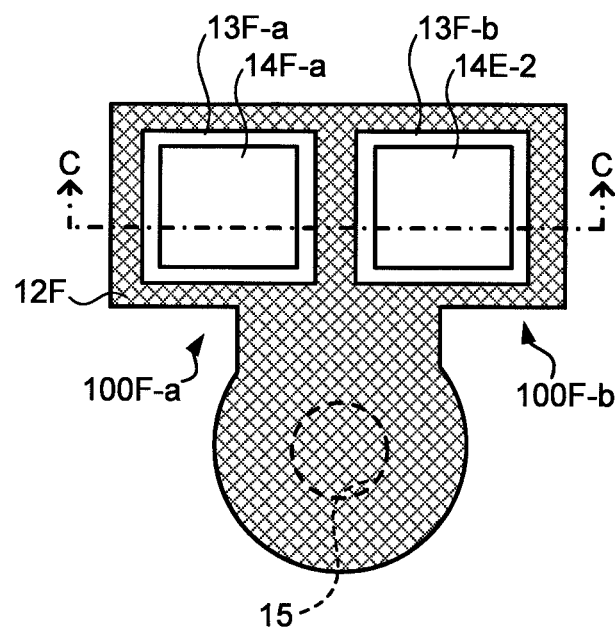
FIG. 30 is a schematic plan view illustrating an interposer according to a seventh embodiment of the present disclosure.
Figure 31:
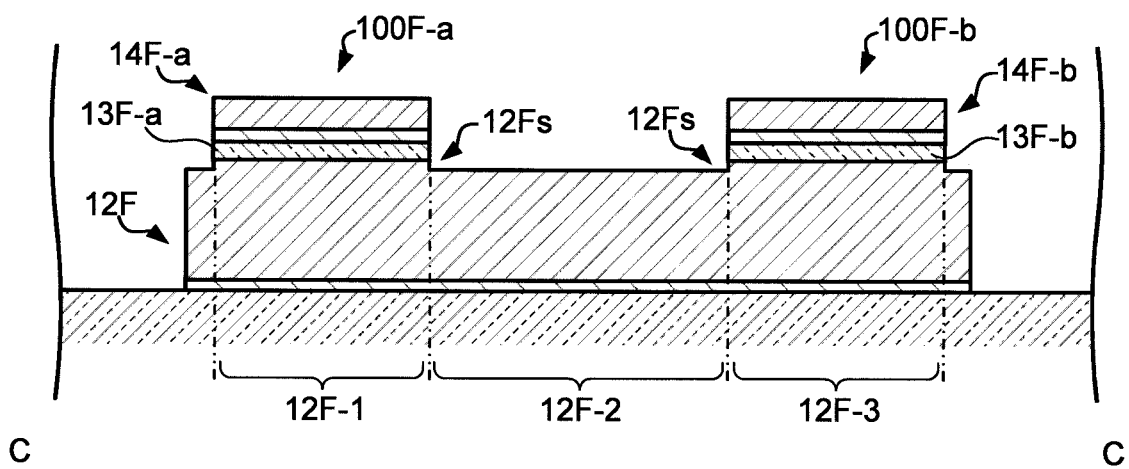
FIG. 31 is a schematic cross-sectional view (C-C line cross-sectional view of FIG. 30) showing a capacitor according to the seventh embodiment of the present disclosure.

FIG. 30 is a schematic plan view showing an interposer according to the seventh embodiment of the present disclosure. FIG. 31 is a schematic cross-sectional view (line C-C cross-sectional view in FIG. 30) showing the capacitor according to the seventh embodiment of the present disclosure. In FIG. 31, a part of the configuration including a portion corresponding to the capacitor is described, and other configurations are omitted. Each of a first capacitor 100F-a and a second capacitor 100F-b in the seventh embodiment has a configuration similar to that of the capacitor 100 in the first embodiment.

In a first conductive layer 12F, by forming a step 12Fs around a region (a region corresponding to a first part 12F-1) of the first capacitor 100F-a and the second capacitor 100F-b, a region (a region corresponding to a second part 12F-2) except for the first capacitor 100F-a and the second capacitor 100F-b is thinner. When one of the two first parts 12F-1 is defined as a third part 12F-3 as shown in FIG. 31, it can be stated as follows. The second part 12F-2 is adjacent to the first part 12F-1 and the third part 12F-3. The first part 12F-1 and the third part 12F-3 are separated by the second part 12F-2.

The first capacitor 100F-a includes the first conductive layer 12F, a first insulating layer 13F-a, and a second conductive layer 14F-a. The second conductive layer 14F-a is disposed on the opposite side to the first part 12F-1 relative to the first insulating layer 13F-a. The second capacitor 100F-b includes the first conductive layer 12F, a first insulating layer 13F-b, and a second conductive layer 14F-b. The second conductive layer 14F-b is disposed on the opposite side to the third part 12F-3 relative to the first insulating layer 13F-b. The first conductive layer 12F is disposed as a common electrode in the first capacitor 100F-a and the second capacitor 100F-b.

In the configuration of the seventh embodiment, the first insulating layer 13F-a and the first insulating layer 13F-b may be disposed continuously as a common insulating layer (referred to as the first insulating layer 13F). In this case, the region in which the first insulating layer 13F exists is a region corresponding to the first part 12F-1, the second part 12F-2 and the third part 12F-3. However, the thickness of the second part 12F-2 is different from the thickness shown in FIG. 31 and is the same thickness as the first part 12F-1 and the third part 12F-3. In this way, without providing the step 12Fs at the border between the second part 12F-2 and the first part 12F-1, and at the border between the second part 12F-2 and the third part 12F-3, so as the continuous first insulating layer 13F to be continuously disposed, it is also possible to avoid the concentration of stress between the capacitors. This configuration can be realized by arranging the pattern of the resist layer 31 shown in FIG. 11 also between the adjacent capacitors.

Eighth Embodiment

In the eighth embodiment, an example in which a plurality of capacitors 100A in the second embodiment are connected via the second conductive layer 14A will be described.

Figure 32:
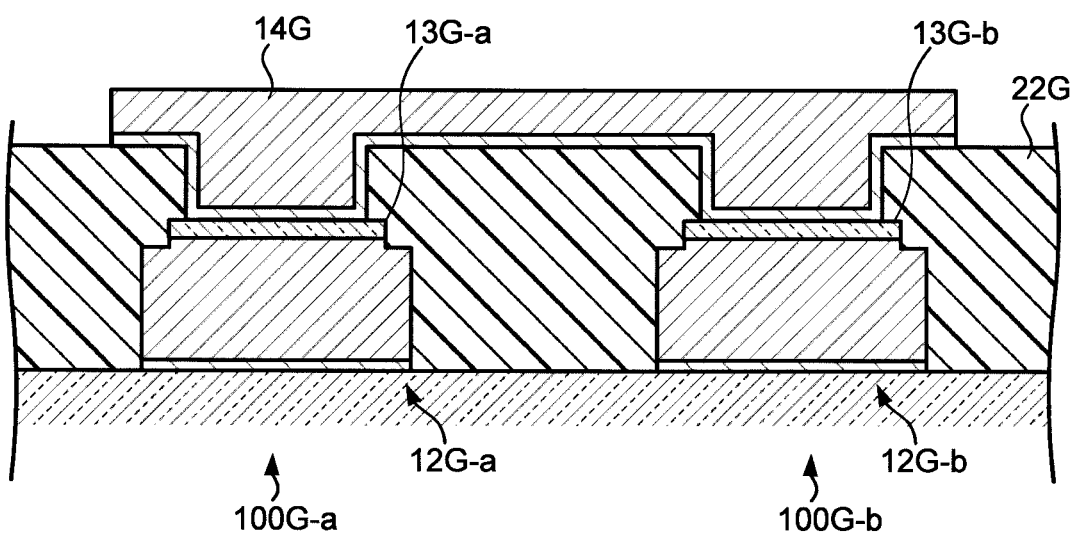
FIG. 32 is a schematic cross-sectional view showing a capacitor according to an eighth embodiment of the present disclosure.

FIG. 32 is a schematic cross-sectional view showing a capacitor according to the eighth embodiment of the present disclosure. As shown in FIG. 32, each of a first capacitor 100G-a and a second capacitor 100G-b has a configuration similar to that of the capacitor 100A in the second embodiment. The first capacitor 100G-a includes a first conductive layer 12G-a, a first insulating layer 13G-a, and a second conductive layer 14G. The second capacitor 100G-b includes a first conductive layer 12G-b, a first insulating layer 13G-b, and the second conductive layer 14G. The second conductive layer 14G is disposed as a common electrode in the first capacitor 100G-a and the second capacitor 100G-b via the portion disposed on a second insulating layer 22G. This makes it possible to realize a configuration in which the first conductive layer 12G-a and the first conductive layer 12G-b are terminal and the first capacitor 100G-a and the second capacitor 100G-b are connected in series. Although not shown, the first conductive layer 12G-a and the first conductive layer 12G-b are electrically connected to form one wiring, and the second conductive layer 14G is separately divided into the first capacitor 100G-a and the second capacitor 100G-b, so that the series connection can be realized in the same method. In this case, a series connection structure similar to the structure of the seventh embodiment shown in FIG. 31 may be used.

Ninth Embodiment

In the ninth embodiment, an example in which the first conductive layer 12G-a and the first conductive layer 12G-b are connected in the eighth embodiment will be described.

Figure 33:
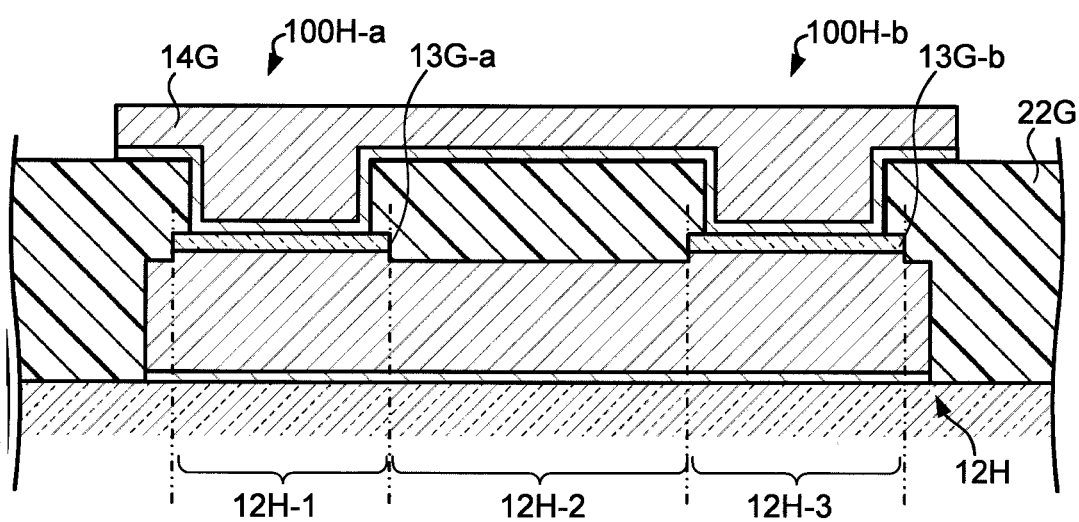
FIG. 33 is a schematic cross-sectional view showing a capacitor according to a ninth embodiment of the present disclosure.

FIG. 33 is a schematic cross-sectional view showing a capacitor according to the ninth embodiment of the present disclosure. Each of a first capacitor 100H-a and a second capacitor 100H-b has a configuration similar to that of the capacitor 100A in the second embodiment. The first capacitor 100H-a includes a first conductive layer 12H, a first insulating layer 13H-a, and a second conductive layer 14H.

The second capacitor 100H-b includes the first conductive layer 12H, a first insulating layer 13H-b, and the second conductive layer 14H. The first conductive layer 12H is disposed as a common electrode in the first capacitor 100H-a and the second capacitor 100H-b. The second conductive layer 14G is disposed as a common electrode in the first capacitor 100H-a and the second capacitor 100H-b via the portion disposed on the second insulating layer 22G.

The first capacitor 100H-a and the second capacitor 100H-b are in a state in which the plurality of capacitors are connected in parallel. Thus, the two capacitors can also be formed integrally without separation. On the other hand, in this example, separating the first insulating layer 13G-a and the first insulating layer 13G-b from each other, to reduce the size of the insulating layer to be integral, so as to form a second part 12H-2 of the first conductive layer 12H between them. Thus, by forming a step at the border between the first part 12H-1 and the second part 12H-2, it is possible to alleviate the stress on the first insulating layer 13G-a and the first insulating layer 13G-b. The idea of reducing the size of the insulating layer to be integrated in this way can be similarly applied to the configuration when the first conductive layer 12G-a and the first conductive layer 12G-b described in the eighth embodiment are integrated.

Tenth Embodiment

In the tenth embodiment, an example in which the first conductive layer has a laminated structure different from that of the first embodiment will be described. Here, the first conductive layer 12 in the first embodiment, a first conductive layer 12J in the tenth embodiment will be described while comparing the side shape of the vicinity of the first surface 11a of the substrate 11.

Figure 34:
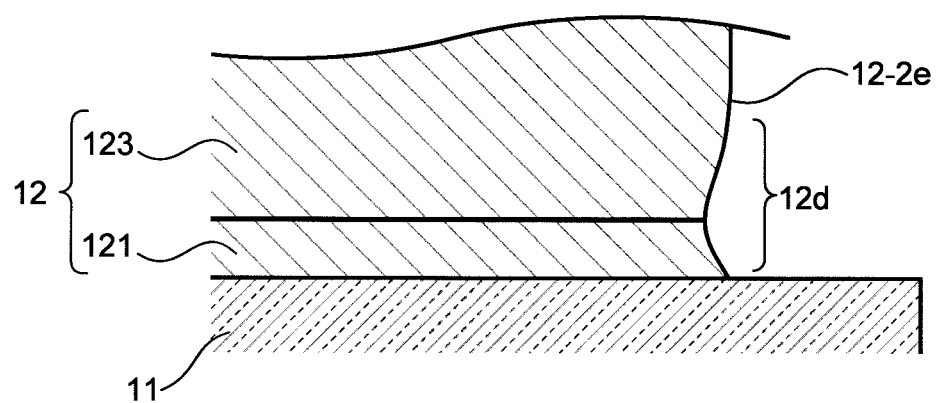
FIG. 34 is a schematic cross-sectional view showing a side shape of a first conductive layer according to the first embodiment of the present disclosure.

FIG. 34 is a schematic cross-sectional view showing a side shape of the first conductive layer according to the first embodiment of the present disclosure. The first conductive layer 12 in the first embodiment has a structure obtained by laminating the first lower conductive layer 121 and the first upper conductive layer 123 as described above. In this example, the first lower conductive layer 121 is Cu formed by electroless plating method, the first upper conductive layer 123 is Cu formed by electrolytic plating method.

Manufacturing the capacitor 100 in the method described in the first embodiment results in a recess 12d in the side surface 12-2e, as shown in FIG. 34. In this example, both the first lower conductive layer 121 and the first upper conductive layer 123 are Cu, but by forming the former by electroless plating method and the latter by electrolytic plating method, the etching rates can differ even in the same etching. Therefore, when the seed layer 121O is removed to form the first lower conductive layer 121, etching process of the first lower conductive layer 121 can be made faster than that of the first upper conductive layer 123. Consequently, etching also proceeds from below the first upper conductive layer 123, it is possible to cause the recess 12d in the side surface 12-2e. The second insulating layer 22 may be formed along the recess 12d to improve the adhesion. The shape of the recess 12d can be variously changed by controlling combinations of the laminated structure, for example, film thickness, property of the film, and the like.

Figure 35:
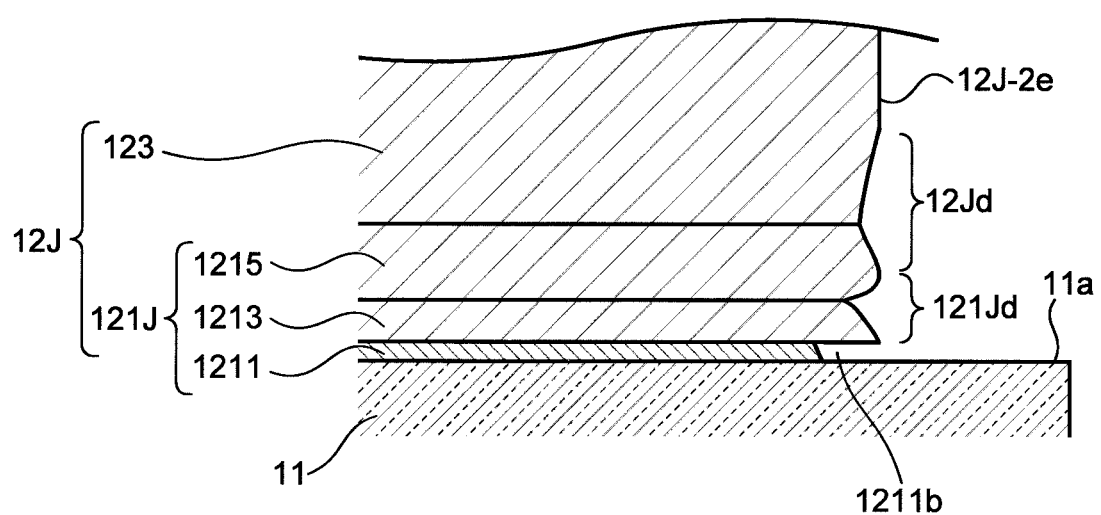
FIG. 35 is a schematic cross-sectional view showing a side shape of a first conductive layer according to a tenth embodiment of the present disclosure.

FIG. 35 is a schematic cross-sectional view showing a side shape of a first conductive layer according to the tenth embodiment of the present disclosure. The first conductive layer 12J shown in FIG. 35 has a structure in which a first lower conductive layer 121J and the first upper conductive layer 123 are laminated. The first lower conductive layer 121J has a structure obtained by laminating a sputtered Ti layer 1211, a sputtered Cu layer 1213, and a vapor-deposited Cu layer 1215. The etching when forming the first lower conductive layer 121J from the seed layer results in recesses 1211b, 121Jd, 12Jd on a side surface 12 H-2e in this example.

As described above, even if the sputtered Cu layer 1213, the vapor-deposited Cu layer 1215, and the first upper conductive layer 123 are all Cu, the etching rate can be different depending on the difference in the forming methods, so that the recesses 121Jd and 12Jd can be formed on the side surface 12H-2e. On the other hand, in the recess 1211b, since the material of the sputtered Ti layer 1211 and the Cu of the upper layer are different, the etching from the lower side of the sputtered Cu layer 1213 hardly progresses. Therefore, the lower surface of the sputtered Cu layer 1213 is approximately parallel to the first surface 11a of the substrate 11. The recess 1211b may be filled with the second insulating layer 22, or a space may be formed in a part thereof.

Eleventh Embodiment

In the eleventh embodiment, an embodiment in which a circular conductive layer is disposed at a circumference of a region in which a plurality of capacitors is disposed will be described.

Figure 36:
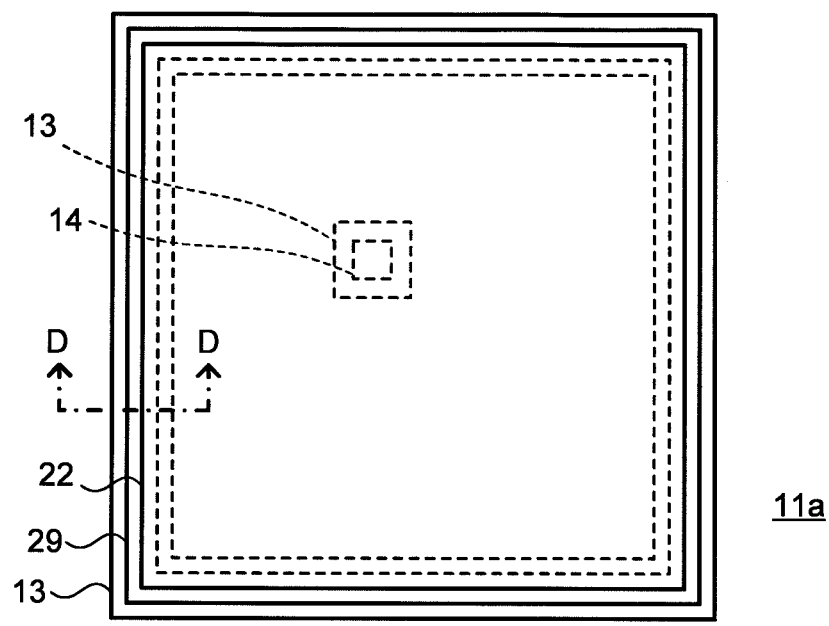
FIG. 36 is a schematic plan view showing an interposer according to an eleventh embodiment of the present disclosure.

FIG. 36 is a schematic plan view showing an interposer according to the eleventh embodiment of the present disclosure. More specifically, FIG. 36 shows the interposer 10 manufactured in the method described in the first embodiment. In this view, many components are omitted for simplicity of explanation, and in the capacitor 100, only a part of the first insulating layer 13 and the second conductive layer 14 formed on the first surface 11a side of the substrate 11 is shown. On the first surface 11a of the substrate 11, the second insulating layer 22 is formed so as to cover the capacitor 100. Around the region where the capacitor 100 is disposed, an annular conductive layer 29 and the first insulating layer 13 are formed along the end of the second insulating layer 22.

Figure 37:
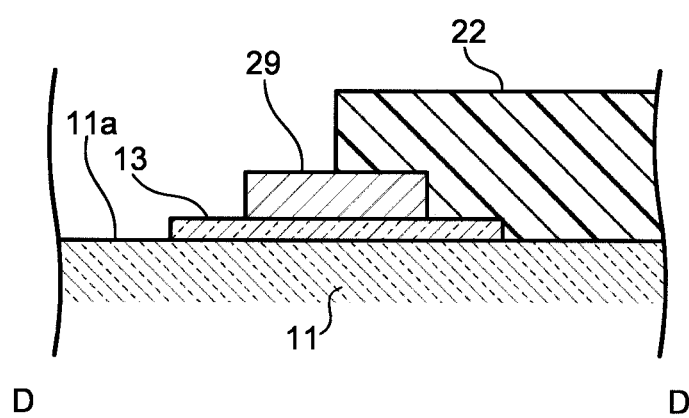
FIG. 37 is a schematic cross-sectional view (D-D line cross-sectional view of FIG. 36) showing an annular conductive layer 29 included in the interposer in the eleventh embodiment of the present disclosure.

FIG. 37 is a schematic cross-sectional view (D-D line cross-sectional view in FIG. 36) showing the annular conductive layer 29 included in the interposer in the eleventh embodiment of the present disclosure. The conductive layer 29 on the first insulating layer 13 formed in an annular shape, is disposed in an annular shape along the first insulating layer 13. Preferably, the width of the first insulating layer 13 is greater than the width of the conductive layer 29. The conductive layer 29 is, for example, is formed simultaneously with the process of forming the second conductive layer 14. When the second conductive layer 14 is formed, along a position where the edge of the second insulating layer 22 is to be formed, the annular conductive layer 29 is also formed on the first insulating layer 13. According to this configuration, in the position of the end of the second insulating layer 22, the first conductive layer 13 wider than the conductive layer 29 is disposed between the conductive layer 29 and the substrate 11. Consequently, adhesion in the end of the second insulating layer 22 is improved by the first insulating layer 13.

Twelfth Embodiment

In the twelfth embodiment, an example in which corner parts in the shape of the edge of the first insulating layer and the second conductive layer have a round shape will be described.

Figure 38:
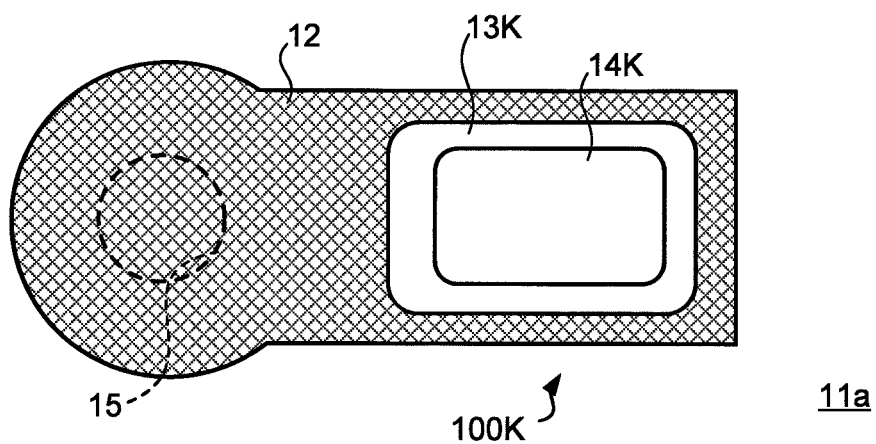
FIG. 38 is a schematic cross-sectional view showing a capacitor according to a twelfth embodiment of the present disclosure.

FIG. 38 is a schematic cross-sectional view showing a capacitor according to the twelfth embodiment of the present disclosure. In a capacitor 100K shown in FIG. 38, the corner portions in a first insulating layer 13K and a second conductive layer 14K have a round shape. By the corner parts of the first insulating layer 13K having a round shape, it is also possible to further reduce the stress applied to the corner parts of the first insulating layer 13K. Similarly, the stress applied to the corner parts of the second conductive layer 14K can be reduced. Thus, it is possible to suppress the first insulating layer 13K and the second conductive layer 14K peeling off from the lower layer.

corner parts of one of the first insulating layer 13K and the second conductive layer 14K may not have a round shape. In addition, any of the plurality of corner parts may not have a round shape, or any of the shapes may be different from the other shapes. In the case of a round shape, for example, when vertical and horizontal length of the first insulating layer 13K and the second conductive layer 14K are 30 μm or more, the radius of curvature is preferably 5 μm or more. On the other hand, when the length is less than 30 μm, the radius of curvature may be further reduced.

Thirteenth Embodiment

In the thirteenth embodiment, an interposer including a capacitor and an inductor will be described.

Figure 39:
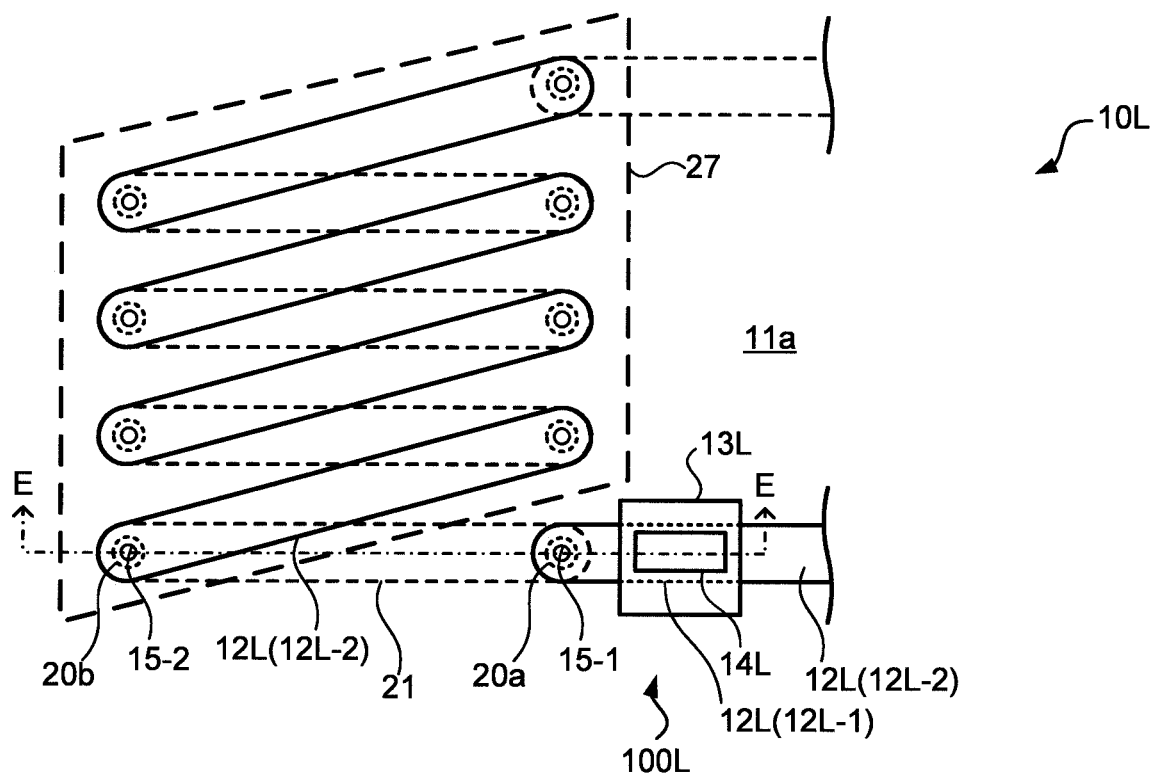
FIG. 39 is a schematic plan view showing a capacitor and an inductor included in an interposer according to a thirteenth embodiment of the present disclosure.
Figure 40:
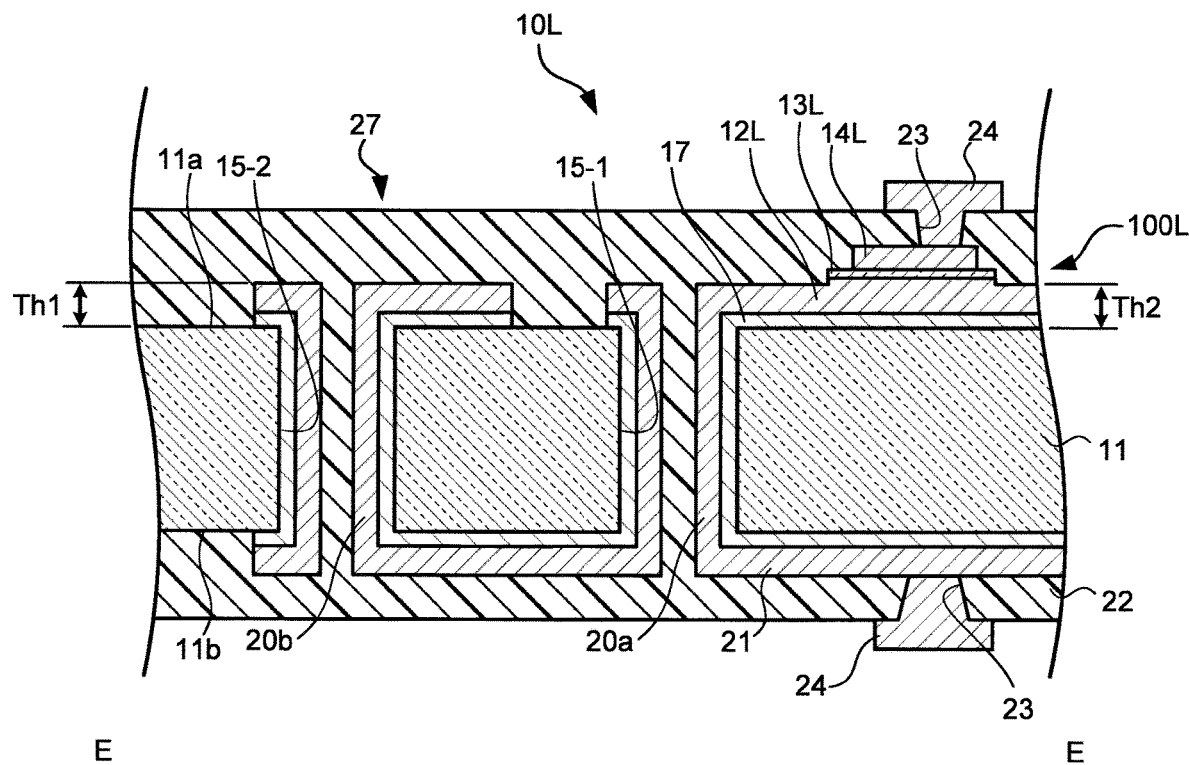
FIG. 40 is a schematic cross-sectional view (E-E line cross-sectional view in FIG. 39) showing the interposer according to the thirteenth embodiment of the present disclosure.

FIG. 39 is a schematic plan view showing a capacitor and an inductor included in an interposer according to the thirteenth embodiment of the present disclosure. This schematic plan view is a plan view showing a first conductive layer 12L of the first surface 11a side of the substrate 11. In FIG. 39, some components such as the connection part 24 have been omitted. FIG. 40 is a schematic cross-sectional view (E-E line cross-sectional view in FIG. 39) showing an interposer according to the thirteenth embodiment of the present disclosure.

As shown in FIG. 39, an interposer 10L may include at least an inductor 27 and a capacitor 100L. The interposer 10L includes at least a third conductive layer 20a electrically connected to the first conductive layer 12L, and a plurality of third conductive layers 20b constituting the inductor 27. The third conductive layer 20a is formed in a through hole 15-1 between the inductor 27 and the capacitor 100L (the first conductive layer 12L, a first insulating layer 13L, and a second conductive layer 14L). Each of the plurality of third conductive layers 20b is formed on each of a plurality of through holes 15-2 in a region (range included in the dotted line) constituting the inductor 27.

As shown in FIG. 40, a part of the first conductive layer 12L on the first surface 11a side of the substrate 11 constitutes the inductor 27, and the other part of the first conductive layer 12L constitutes the lower electrode of the capacitor 100L. On the first surface 11a side of the substrate 11, a thickness Th1 of the first conductive layer 12L constituting the inductor 27 may be substantially the same as an outer thickness Th2 of the first conductive layer 12L constituting the lower electrode of the capacitor 100L (corresponds to the second part). When the thicknesses of the two satisfy the following relationship, they can be regarded as substantially the same.

$$-10\% \leq (Th1-Th2)/Th1 \leq +10\%$$

Th1 may be 0.5 μm or more and 30 μm or less but may be more preferably 5 μm or more and 20 μm or less. This is because the performance of the inductor 27 is improved. The thickness of the third conductive layers 20a, 20b may be 50% or more and 100% or less of Th1 on the first surface 11a of the substrate 11.

Fourteenth Embodiment

In the fourteenth embodiment, a capacitor in which d1=0 in the first embodiment will be described.

Figure 41:
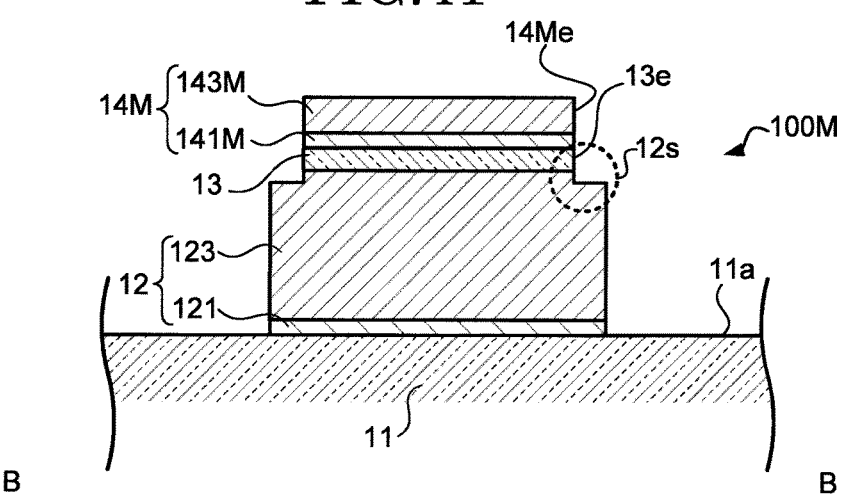
FIG. 41 is a schematic cross-sectional view showing a capacitor according to a fourteenth embodiment of the present disclosure.

FIG. 41 is a schematic cross-sectional view showing a capacitor according to the fourteenth embodiment of the present disclosure. A capacitor 100M shown in FIG. 41 corresponds to the case where d1=0 in the capacitor 100 according to the first embodiment. That is, the side surface 13e of the first insulating layer 13 and a side surface 14Me of a second conductive layer 14M form the same plane, when viewed along the normal direction of the surface of the substrate 11, the side surface 13e and the side surface 14Me are aligned. The alignment of the side surface 13e and the side surface 14Me is not limited to the case where they are perfectly coincident with each other and includes the case where they are substantially coincident with each other. Substantially coincidence, for example, d1 may be less than or equal to d2 d1 may be 0.1 μm or less, d1 may be 1% or less of the thickness of the second conductive layer 14M, and d1 may be 50% or less of the thickness of the first insulating layer 13.

The side surface 13e of the first insulating layer 13 and the side surface 14e of the second conductive layer 14M are aligned in this way, since an end surface of the second conductive layer 14M is not formed on the first insulating layer 13, it is possible to prevent a part where the stress is concentrated from being generated on the first insulating layer 13. Therefore, it is also possible to suppress the crack to the first insulating layer 13, and it is also possible to suppress the first insulating layer 13 and the second conductive layer 14M from peeling off each other.

Figure 42:
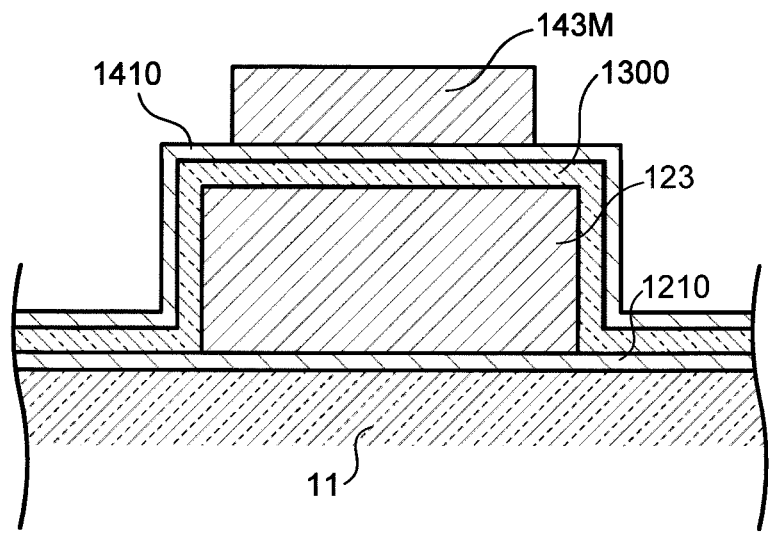
FIG. 42 is a diagram illustrating a manufacturing method of the capacitor according to the fourteenth embodiment of the present disclosure.

FIG. 42 is a diagram illustrating a manufacturing method of a capacitor according to the fourteenth embodiment of the present disclosure. FIG. 42 forms the seed layer 1410 so as to cover the insulating layer 1300 in the state of FIG. 10 in the first embodiment and forms a second upper conductive layer 143M in the same method as in the first embodiment.

Figure 43:
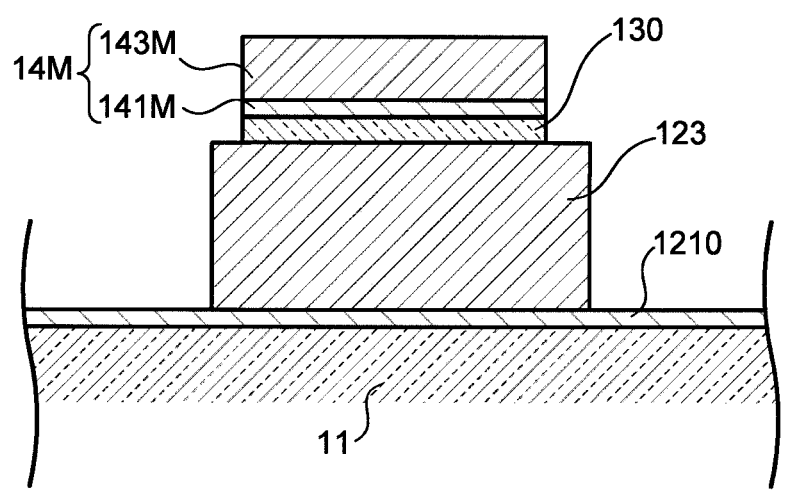
FIG. 43 is a diagram illustrating the manufacturing method of the capacitor according to the fourteenth embodiment of the present disclosure.

FIG. 43 is a diagram illustrating a manufacturing method of a capacitor according to the fourteenth embodiment of the present disclosure. In the state of FIG. 42, a second lower conductive layer 141M and the first insulating layer 13 are formed by removing the seed layer 1410 and the insulating layer 1300 except for those covered by the second upper conductive layer 143M. Thereafter, form the step 12s by removing a part of the first upper conductive layer 123 exposed from the first insulating layer 13. At this time, the seed layer 1210 exposed from the first upper conductive layer 123 is also removed. The capacitor 100M shown in FIG. 41 is realized in this way.

Fifteenth Embodiment

In the fifteenth embodiment, a semiconductor device manufactured using the interposer 10 in the first embodiment will be described.

Figure 44:
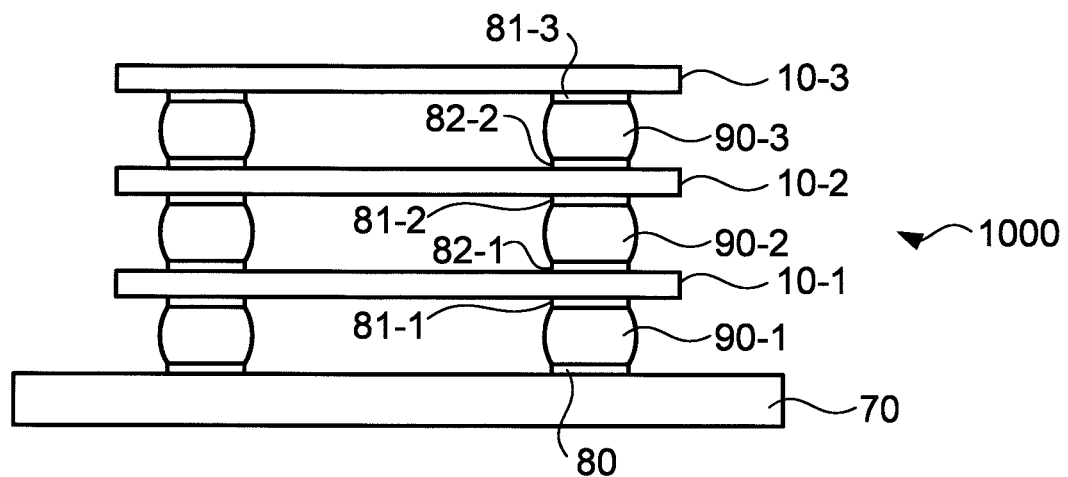
FIG. 44 is a diagram showing a semiconductor device according to a fifteenth embodiment of the present disclosure.

FIG. 44 is a diagram showing a semiconductor device according to the fifteenth embodiment of the present disclosure. A semiconductor device 1000 has three stacked interposers 10 (10-1, 10-2, 10-3) and is connected to an LSI substrate 70. An interposer 10-1 includes, for example, a semiconductor element such as DRAM, and connecting terminals 81-1 and 82-1 formed of the connection part 24 or the like. These interposers 10 (10-1, 10-2, 10-3) may not use a glass substrate, and some of the interposers 10 may use a substrate using different materials from other interposers 10. The connecting terminal 81-1 is connected to a connecting terminal 80 of the LSI substrate 70 via a bump 90-1. The connecting terminal 82-1 is connected to a connecting terminal 81-2 of the interposer 10-2 via a bump 90-2. The connecting terminal 82-2 of the interposer 10-2 and a connecting terminal 83-1 of the interposer 10-3 are also connected via a bump 90-3. As the bumps 90 (90-1, 90-2, 90-3), for example, a metal such as indium, copper, gold, or the like is used.

In the case of stacking the interposer 10, the number of layers is not limited to three, but may be two or four or more. Connection between the interposer 10 and other substrate is not limited to by the bumps, other bonding techniques such as eutectic bonding may be used. A polyimide, an epoxy resin, or the like may be applied and baked to bond the interposer 10 and the other substrate.

Figure 45:
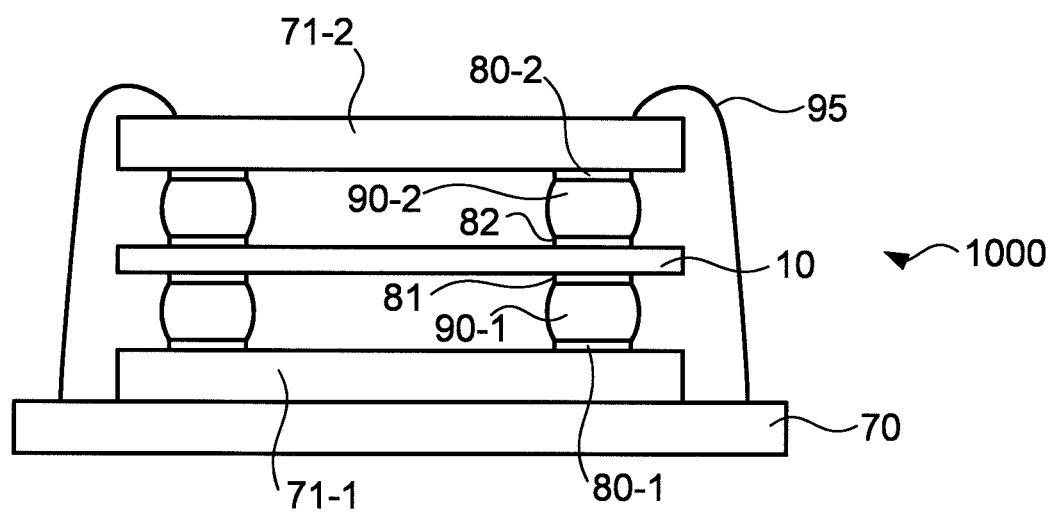
FIG. 45 is a diagram showing another example of the semiconductor device according to the fifteenth embodiment of the present disclosure.

FIG. 45 is a diagram illustrating another exemplary semiconductor device according to the fifteenth embodiment of the present disclosure. The semiconductor device 1000 shown in FIG. 45 has a stacked structure obtained by stacking semiconductor circuit substrates (semiconductor chip) 71-1, 71-2 such as a MEMS device, CPU, and the interposer 10, is connected to the LSI substrate 70.

The interposer 10 is disposed between the semiconductor circuit substrate 71-1 and the semiconductor circuit substrate 71-2 and is connected to each of them via the bumps 90-1 and 90-2. The semiconductor circuit substrate 71-1 is mounted on the LSI substrate 70. The LSI substrate 70 and the semiconductor-circuit substrate 71-2 are connected by a wire 95. In this example, the interposer 10 is used as an interposer for three-dimensionally mounting a plurality of stacked semiconductor circuit substrates. A multi-functional semiconductor device can be realized by connecting the interposer 10 to the plurality of semiconductor circuit substrates having different functions. For example, by using the semiconductor circuit substrate 71-1 as a three-axis acceleration sensor and the semiconductor circuit substrate 71-2 as a two-axis magnetic sensor, it is possible to realize a semiconductor device in which a five-axis motion sensor is realized by one module.

When the semiconductor circuit substrate is a sensor formed by a MEMS device, the sensing result may be output by an analog signal. In this case, a low-pass filter, an amplifier, and the like may also be formed in the semiconductor circuit substrate or the interposer 10.

Figure 46:
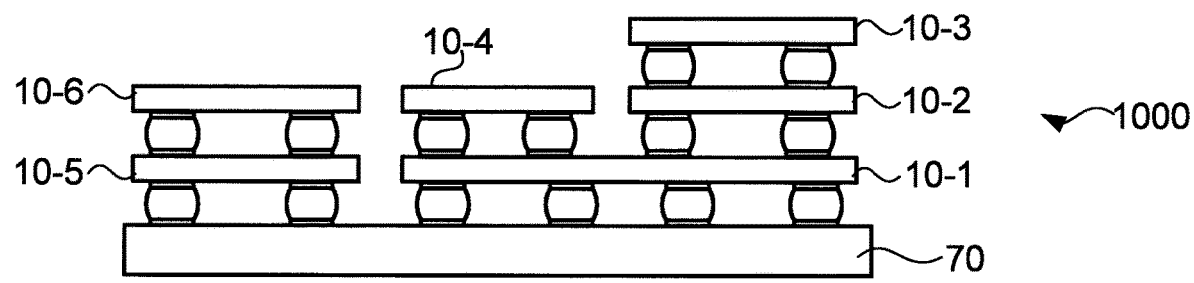
FIG. 46 is a diagram showing yet another example of the semiconductor device according to the fifteenth embodiment of the present disclosure.

FIG. 46 is a diagram showing yet another example of the semiconductor device according to the fifteenth embodiment of the present disclosure. The above two examples (FIG. 44 and FIG. 45) are three-dimensional mountings, but in this example, they are examples applied to 2.5-dimensional mountings. In the example shown in FIG. 46, the six interposers 10 (10-1 to 10-6) are stacked and connected to the LSI substrate 70. However, not only all the interposers 10 are stacked and disposed, but are disposed side by side in an in-plane direction of the substrate.

In the example of FIG. 46, the interposers 10-1 and 10-5 are connected on the LSI substrate 70, the interposers 10-2 and 10-4 are connected on the interposer 10-1, the interposer 10-3 is connected on the interposer 10-2, and the interposer 10-6 is connected on the interposer 10-5. As the example shown in FIG. 46, even if the interposer 10 is used as an interposer for connecting the plurality of semiconductor circuit substrates, such a 2.5-dimensional mounting is possible. For example, the interposers 10-3, 10-4, 10-6, and the like may be replaced by the semiconductor circuit substrate.

The semiconductor device 1000 manufactured as described above, for example, mounted on a variety of electronic devices such as a portable terminal, an information processing device, home appliances. More specifically, the portable terminal includes a cellular phone, a smart phone, a laptop personal computer, and the like. More specifically, the information processing device includes a desktop personal computer, a server, a car navigation system, and the like. Examples of the electronic devices may be, for example, wireless local area network (LAN) devices, set-top boxes, music players, video players, entertainment units, navigation devices, communication devices, personal digital assistants (PDA), fixed location data units.

Figure 47:
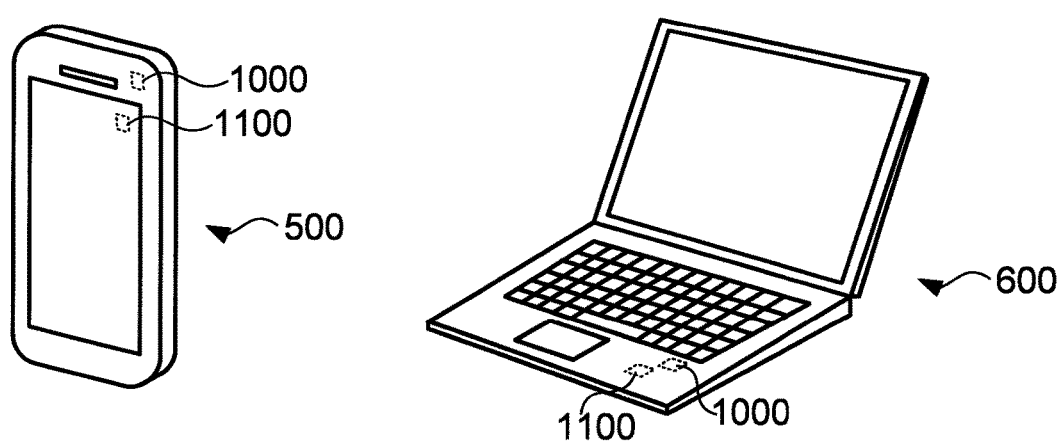
FIG. 47 is a diagram illustrating an exemplary electronic device including the semiconductor device according to the fifteenth embodiment of the present disclosure.

FIG. 47 is a diagram illustrating an exemplary electronic device using the semiconductor device according to the fifteenth embodiment of the present disclosure. A smartphone 500 and a laptop personal computer 600 are shown as the example of the electronic device mounted with the semiconductor device 1000. These electronic devices include a control unit 1100 configured by the CPU and the like that executes application programs to implement various functions. The various functions include a function of using an output signal from the semiconductor device 1000. The semiconductor device 1000 may have the function of the control unit 1100.

<Modifications>

The present disclosure is not limited to the embodiments described above, and various other modifications are included. For example, the above-described embodiments have been described in detail for the purpose of illustrating the present disclosure easily and are not necessarily limited to those comprising all the configurations described. In addition, a part of the configuration of one embodiment may be replaced with the configuration of another embodiment, and the configuration of another embodiment may be added to the configuration of one embodiment. Further, it is possible to add, delete, or replace a part of the configuration of each embodiment. Hereinafter, some modifications will be described. The example in which the first embodiment is modified can also be applied to an example in which another embodiment is modified.

(1) Although the first conductive layer 12 and the second conductive layer 14 both had a laminated structure including the seed layer and the conductive layer formed by electrolytic plating method, it may be a conductive layer formed by another method. That is, at least one or both of the first conductive layer 12 and the second conductive layer 14 may have a single-layer structure.

Examples of the method for forming the conductive layer include a deposition method including chemical vapor deposition (CVD) and physical vapor deposition (PVD). Examples of the chemical vapor deposition include plasma CVD and atomic layer deposition (ALD). Examples of the physical vapor deposition include, for example, sputtering or vacuum vapor deposition. Further, it may be formed by etching of a metal foil or by applying a conductive paste such as a metal nano paste. Similarly, for the first insulating layer 13 may be formed by a vapor deposition method including chemical vapor deposition (CVD) and physical vapor deposition (PVD).

The conductive layer and the insulating layer may be formed with the desired pattern by photolithography or planarized by etch-back or chemical mechanical polishing.

(2) The materials of the first conductive layer 12 and the second conductive layer 14 are not limited to Cu, and may include conductive materials such as gold (Au), silver (Ag), copper (Cu), iron (Fe), nickel (Ni), platinum (Pt), palladium (Pd), ruthenium (Ru), and tungsten (W).

(3) The second insulating layer 22 is an organic material, but may be an inorganic material, or may be a laminated structure of an insulating layer of an inorganic material and an insulating layer of an organic material.

(4) The first insulating layer 13 is not only disposed in the portion constituting the capacitor 100, may be disposed as the first insulating layer 13 in addition to the portion constituting the capacitor 100. At this time, the first insulating layer 13 of the portion constituting the capacitor 100 and the first insulating layer 13 of the other portion may be apart from each other or may be continuous. The first insulating layer 13 except for the portion constituting the capacitor 100, for example, may be formed so as to cover at least a part of the third conductive layer 20 of the through hole 15.

According to this configuration, for example, when removing the seed layer by etching after forming the first insulating layer 13, a part of the third conductive layer 20, in particular the conductive layer in the corner part of the through hole 15 (the border part between the first conductive layer 12 and the third conductive layer 20) is protected by the first insulating layer 13, it is possible to prevent the conductive layer of the protected part from being thinned.

(5) The third conductive layer 20 formed inside the through hole 15 is formed along the inner surface 15*a* of the through hole 15 and disposed so as not to block the through hole 15, but may be disposed so as to block at least one of the first surface 11*a* side and the second surface 11*b* side of the through hole 15 or may be disposed so as to block the entire through hole 15. When the entire through hole 15 is closed, in other words, the third conductive layer 20 is formed so as to fill the through hole 15.

In the twelfth embodiment, the capacitor 100L and the inductor 27 are connected by the third conductive layer 20*a*. When the third conductive layer 20*a* is modified into a configuration in which the through hole 15-1 is disposed so as to be closed at least in the vicinity of the first surface 11*a*, at least a part of the capacitor 100L may be formed directly above the through hole 15-1 by forming the conductive layer closing the through hole 15-1 as a part or all of the first conductive layer 12L.

(6) The example in which the capacitor 100 is disposed in the interposer 10 described above is shown, but is not limited to when applied to the interposer 10 including the through electrode, such as the third conductive layer 20, as long as it is disposed in a wiring substrate containing a conductive layer. Such wiring substrate may not include a through electrode. In this case, the conductive layer may be disposed only on the first surface 11*a* side of the substrate 11.

The substrate in which the capacitor 100 is disposed is not limited to the application as an interposer disposed between the circuit substrate and the semiconductor chip or the like, even when it includes a through electrode, for example, it may be applied to the application as a through electrode substrate. Here, the through electrode substrate includes not only an interposer disposed between the circuit substrate and the semiconductor chip or the like, but also includes an IPD (Integrated Passive Device) or the like that does not install a semiconductor chip or the like. In this case, one of the upper and lower circuit substrates is exist so as to be electrically connected to the through electrode. On the other hand, the semiconductor chip or the like may be disposed on the circuit substrate at a position different from the through electrode substrate and electrically connected to the circuit substrate.

(7) Although the example in which the capacitor 100 is disposed on only one surface side of the substrate 11 is shown, it may be disposed on both surface sides.

(8) In the capacitor 100, either between the substrate 11 and the first conductive layer 12, between the first conductive layer 12 and the first insulating layer 13, between the first insulating layer 13 and the second conductive layer 14, or in all cases, a layer not shown may be formed.

(9) The respective material may be determined so that the thermal expansion coefficient of the second lower conductive layer 141 is between the thermal expansion coefficient of the first insulating layer 13 and the thermal expansion coefficient of the second upper conductive layer 143. For example, when the second upper conductive layer 143 is formed of Cu having thermal expansion coefficient of 16.8 ppm/K and the first insulating layer 13 is formed of silicon nitride having thermal expansion coefficient of 3.25 ppm/K, the second lower conductive layer 141 may be formed of Ti (8.4 ppm/K), Cr (8.2 ppm/K), Ni (13.4 ppm/K), or the like, thereby further relieving the stress. When the second lower conductive layer 141 is formed by a plurality of films, each of the films is preferably formed so that the closer the film is to the first insulating layer 13, the closer the thermal expansion coefficient of the film is to that of the first insulating layer 13, and the closer the film is to the second upper conductive layer 143, the closer the thermal expansion coefficient of the film is to that of the second upper conductive layer 143. For example, the second lower conductive layer 141 may be formed by the laminated films which include a Ni film disposed on the second upper conductive layer 143 (Cu) side and a Ti or Cr film disposed on the first insulating layer 13 (silicon nitride) side.

What is claimed is:

1. A wiring substrate comprising:
   a substrate having an insulating surface;
   a first conducting layer disposed on the substrate and including a first part and a second part, the first part having a first thickness, the second part having a second thickness thinner than the first thickness and being adjacent to the first part;
   a first insulating layer disposed on the first part and apart from the second part; and
   a second conducting layer, the first insulating layer being disposed between the second conducting layer and the first part,
   wherein the first part is an entire part of the first conducting layer that is in contact with the first insulating layer.

2. The wiring substrate according to claim 1, wherein the first part and the second part include a region formed of the same material in the first insulating layer side.

3. The wiring substrate according to claim 1, wherein:
   the first conducting layer includes a first film and a second film;
   a property of the first film is different from that of the second film;
   the second film is sandwiched between the first film and the first insulating layer; and
   the second film in the second part is thinner than the second film in the first part.

4. The wiring substrate according to claim 1, wherein:
   the second conducting layer is apart from a first edge corresponding to a part close to the second part of the edge of the first insulating layer.

5. The wiring substrate according to claim 1, wherein:
   when viewed along a normal direction to the surface of the substrate, at least part of the edge of the second conducting layer is aligned with a first edge corresponding to a part close to the second part of the edge of the first insulating layer.

6. The wiring substrate according to claim 5, wherein when viewed along the normal direction to the surface of the substrate, a first distance between the first edge and the border between the first part and the second part is shorter than a second distance between the edge of the second conducting layer and the first edge.

7. The wiring substrate according to claim 1, wherein when viewed along a normal direction to the surface of the substrate, a distance between the first edge and a border between the first part and the second part is shorter than a difference between the first thickness and the second thickness.

8. The wiring substrate according to claim 7, wherein the border is positioned between the first insulating layer and the substrate.

9. The wiring substrate according to claim 1, wherein a distance between the edge of the second part and a border between the first part and the second part when viewed along a normal direction to the surface of the substrate is longer than the difference between the first thickness and the second thickness.

10. The wiring substrate according to claim 1, wherein a distance between the edge of the second part and a boundary between the first part and the second part when viewed along a normal direction to the surface of the substrate is 10% or more of the second thickness.

11. A wiring substrate according to claim 1, comprising:
    a substrate having an insulating surface;
    a first conducting layer disposed on the substrate and including a first part and a second part, the first part having a first thickness, the second part having a second thickness thinner than the first thickness and being adjacent to the first part;
    a first insulating layer disposed on the first part and apart from the second part; and
    a second conducting layer, the first insulating layer being disposed between the second conducting layer and the first part,
    wherein when viewed along a normal direction to the surface of the substrate, the first part is surrounded by the second part.

12. The wiring substrate according to claim 1, wherein when viewed along a normal direction to the surface of the substrate, an outer edge of the first conducting layer includes a first side surface of the first part and a second side surface of the second part.

13. The wiring substrate according to claim 12, wherein the first insulating layer covers the first side surface of the first part.

14. The wiring substrate according to claim 13, wherein a part of the first insulating layer is sandwiched between the second conducting layer and the first side surface of the first part.

15. The wiring substrate according to claim 1, wherein a second surface of the second part is rougher than a first surface of the first part.

16. The wiring substrate according to claim 1, wherein:
    the first conducting layer includes a first film and a second film, a property of the first film is different from that of the second film.

17. The wiring substrate according to claim 16, wherein a first side surface of the first conducting layer has a recess formed by a first side surface of the first film and a second side surface of the second film.

18. The wiring substrate according to claim 1, further comprising a second insulating layer contacting with the second part and the first insulating layer,
wherein:
the first insulating layer includes an inorganic material; and
the second insulating layer includes an organic material.

19. The wiring substrate according to claim 18, wherein the second insulating layer has an opening;
the second conducting layer contacts with a side surface of the second insulating layer defining the opening; and
the second insulating layer is disposed in a part of between the second conducting layer and the first insulating layer.

20. The wiring substrate according to claim 1, further comprising a conducting layer apart from the second conducting layer, the first insulating layer being disposed between the second conducting layer and the first part.

21. A wiring substrate comprising:
a substrate having an insulating surface;
a first conducting layer disposed on the substrate and including a first part, a second part, and a third part, the first part having a first thickness, the second part having a second thickness, and the third part having a third thickness, the second thickness being thinner than the first thickness and the third thickness, the first part being adjacent to the second part, and the third part being adjacent to the second part;
a first insulating layer disposed on the first part and the third part, the first insulating layer being apart from the second part; and
a second conducting layer, the first insulating layer being disposed between: (i) the second conducting layer and the first part, and (ii) the second conducting layer and the third part,
wherein the first part and the third part are an entire part of the first conducting layer that is in contact with the first insulating layer.

22. The wiring substrate according to claim 1, further comprising a through electrode penetrating the substrate,
wherein the through electrode is electrically connected to the first conducting layer.

23. The wiring substrate according to claim 22, wherein the through electrode is formed of the same material as the first conducting layer and continuously extended from the first conducting layer.

24. The wiring substrate according to claim 22, wherein:
the first conducting layer includes a plurality of films;
the through electrode includes a plurality of films; and
a film closest to the substrate of the first conducting layer is continuously extended to a film closest to the substrate of the through electrode.

25. The wiring substrate according to claim 22, further comprising an inductor including the through electrode connected to the first conducting layer.

26. A semiconductor device comprising:
the wiring substrate according to claim 1; and
a semiconductor chip electrically connected to the wiring substrate.

* * * * *